US012657360B2

(12) United States Patent　　(10) Patent No.:　US 12,657,360 B2
Jones et al.　　(45) Date of Patent:　Jun. 16, 2026

(54) DIGITAL DESIGN SIMULATION ACCELERATOR

(71) Applicant: Altair Engineering Canada, Ltd., Toronto (CA)

(72) Inventors: David Jones, Ottawa (CA); Shona Weldon, Ottawa (CA)

(73) Assignee: Siemens Industry Software Inc., Plano, TX (US)

( * ) Notice: Subject to any disclaimer, the term of this patent is extended or adjusted under 35 U.S.C. 154(b) by 822 days.

(21) Appl. No.: 17/960,742

(22) Filed: Oct. 5, 2022

(65) Prior Publication Data

US 2023/0186003 A1　　Jun. 15, 2023

Related U.S. Application Data

(60) Provisional application No. 63/288,053, filed on Dec. 10, 2021.

(51) Int. Cl.
G06F 30/327　　(2020.01)
G06F 30/33　　(2020.01)

(52) U.S. Cl.
CPC ............ G06F 30/327 (2020.01); G06F 30/33 (2020.01)

(58) Field of Classification Search
USPC ........................................................ 716/104
See application file for complete search history.

(56) References Cited

U.S. PATENT DOCUMENTS

| | | | |
|---|---|---|---|
| 6,108,745 A | 8/2000 | Gupta et al. | |
| 6,625,081 B2 | 9/2003 | Roohparvar et al. | |
| 6,836,877 B1 * | 12/2004 | Dupenloup | G06F 30/30 716/132 |
| 7,567,893 B2 * | 7/2009 | Torossian | G06F 30/33 703/16 |
| 8,327,187 B1 | 12/2012 | Metcalf | |
| 8,549,258 B2 | 10/2013 | Lee et al. | |
| 9,311,259 B2 | 4/2016 | Greiner et al. | |
| 9,430,596 B2 * | 8/2016 | Bashteen | G06F 30/3308 |
| 10,503,504 B2 * | 12/2019 | Chou | G06F 9/30029 |
| 10,565,335 B2 | 2/2020 | Chou et al. | |
| 11,023,642 B2 * | 6/2021 | Chou | G06F 30/33 |
| 2008/0184195 A1 | 7/2008 | Lee et al. | |
| 2013/0125097 A1 * | 5/2013 | Ebcioglu | G06F 8/4452 717/136 |
| 2014/0282312 A1 * | 9/2014 | Stamness | G06F 30/3308 716/106 |
| 2019/0384598 A1 * | 12/2019 | Chou | G06F 30/367 |

* cited by examiner

*Primary Examiner* — Mohammed Alam

(57) ABSTRACT

A simulation acceleration system is provided. The system includes a simulation accelerator that receives compiled code of a design that includes register transfer level (RTL) components and testbench components. The compiled code includes instructions for simulating behaviors of the design. The simulation accelerator schedules the instructions to be executed by multiple processors based on simulation events occurring at different simulation timesteps. The simulation events are determined according to the executed instructions. The simulation accelerator captures trace data generated by the execution of the scheduled instructions and provides the captured trace data.

14 Claims, 16 Drawing Sheets

** Instruction has been executed

** Instruction has been executed

DIGITAL DESIGN SIMULATION ACCELERATOR

BACKGROUND

Technical Field

The present disclosure generally relates to verification of design of digital circuits by simulation.

Description of the Related Arts

Verification of design by simulation is a key component of the engineering process for building complex hardware such as integrated circuits (ICs). Design simulation helps engineers verify and validate the intended function of a product under development, as well as the manufacturability of the product.

SUMMARY

Some embodiments of the disclosure provide a simulation acceleration system. The system includes a simulation accelerator that receives compiled code of a design that includes register transfer level (RTL) components and testbench components. The compiled code includes instructions for simulating behaviors of the design. The simulation accelerator schedules the instructions to be executed by multiple processors based on simulation events occurring at different simulation timesteps. The simulation events are determined according to the executed instructions. The simulation accelerator captures trace data generated by the execution of the scheduled instructions and provides the captured trace data.

In some embodiments, the compiled code includes levelized blocks and un-levelized blocks. Levelized blocks are statically sorted into levels such that blocks of a same level have no logical dependency with each other. In some embodiments, the instructions are scheduled so instructions of a levelized block are not executed in parallel with instructions of blocks in a different level or with instructions of un-levelized blocks. In some embodiments, the RTL components of the design are compiled as levelized blocks and at least some of the testbench components are compiled as un-levelized blocks.

In some embodiments, the instructions of the compiled code include one or more transactions. Each transaction includes one or more instructions designated as belonging to the transaction. Upon completion of the transaction, data generated by a processor executing the transaction is committed to a heap memory and is aborted when an abort condition has occurred. In some embodiments, an abort condition occurs when two or more processor cores have conflicting operations such as when (i) a processor writes a piece of data and another reads the same data or (ii) a processor writes a piece of data and another processor writes the same data. In some embodiments, instructions of levelized blocks are not executed as transactions.

In some embodiments, a transaction may include an instruction that is deferred to execute until the particular transaction is committed, the deferred instruction may mutate a global state and return no result. In some embodiments, when a first transaction and a second transaction are scheduled to be executed in the same timestep, the execution of the first transaction aborts and restarts after the second transaction is complete in the same timestep.

In some embodiments, the compiled code includes multiple prefetch sections that are defined by a compiler. Each prefetch section comprises a set of instructions that occupies a memory storage space that can fit within an instruction cache of a processor. The compiled code may include a set of prefetching directives that is determined based on relationships between logical blocks in the design by the compiler. The simulation accelerator identifies one or more prefetch sections according to the prefetching directives and prefetches the identified prefetch sections for the processor. In some embodiments, when the accelerator prefetches a set of instructions that falls within a prefetch section from the instruction memory, a corresponding set of data (e.g., data that are statically determined to be accessed by the instructions in the prefetch section) is also prefetched from the data memory.

In some embodiments, the multiple processors request memory allocations from a memory gasket. The memory gasket includes multiple queues for storing pointers of available memory allocations of a specific size. The simulation accelerator may reclaim memory allocations that are no longer referenced and replenish the queues of the memory gasket with the reclaimed memory allocations.

The preceding Summary is intended to serve as a brief introduction to some embodiments of the disclosure. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a Summary, Detailed Description and the Drawings are provided. Moreover, the claimed subject matter is not to be limited by the illustrative details in the Summary, Detailed Description, and the Drawings, but rather is to be defined by the appended claims, because the claimed subject matter can be embodied in other specific forms without departing from the spirit of the subject matter.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

For a modern digital design simulation, a design and a testbench for testing the design likely have a very large dataset. Such a very large data set is typically accessed in a random manner, without good locality, and does not fit in cache. Consequently, the performance of such a simulation is often negatively impacted by memory access latency. For example, on a x86-64 bit machine, a read that misses in all levels cache can take ~100 clocks to return data. If the program logic depends on the read result then the processor will stall until data returns.

Some embodiments of the disclosure provide a simulation acceleration system having dedicated hardware (or accelerator) that achieves performance improvement in digital design simulation. The accelerator hardware performs simulation on RTL and testbench codes that are compiled by a specialized compiler. The system is expected to achieve 10-20× simulation performance over a single-core 64-bit CPU system (e.g., x86), while supporting all SystemVerilog constructs.

Figure 1:
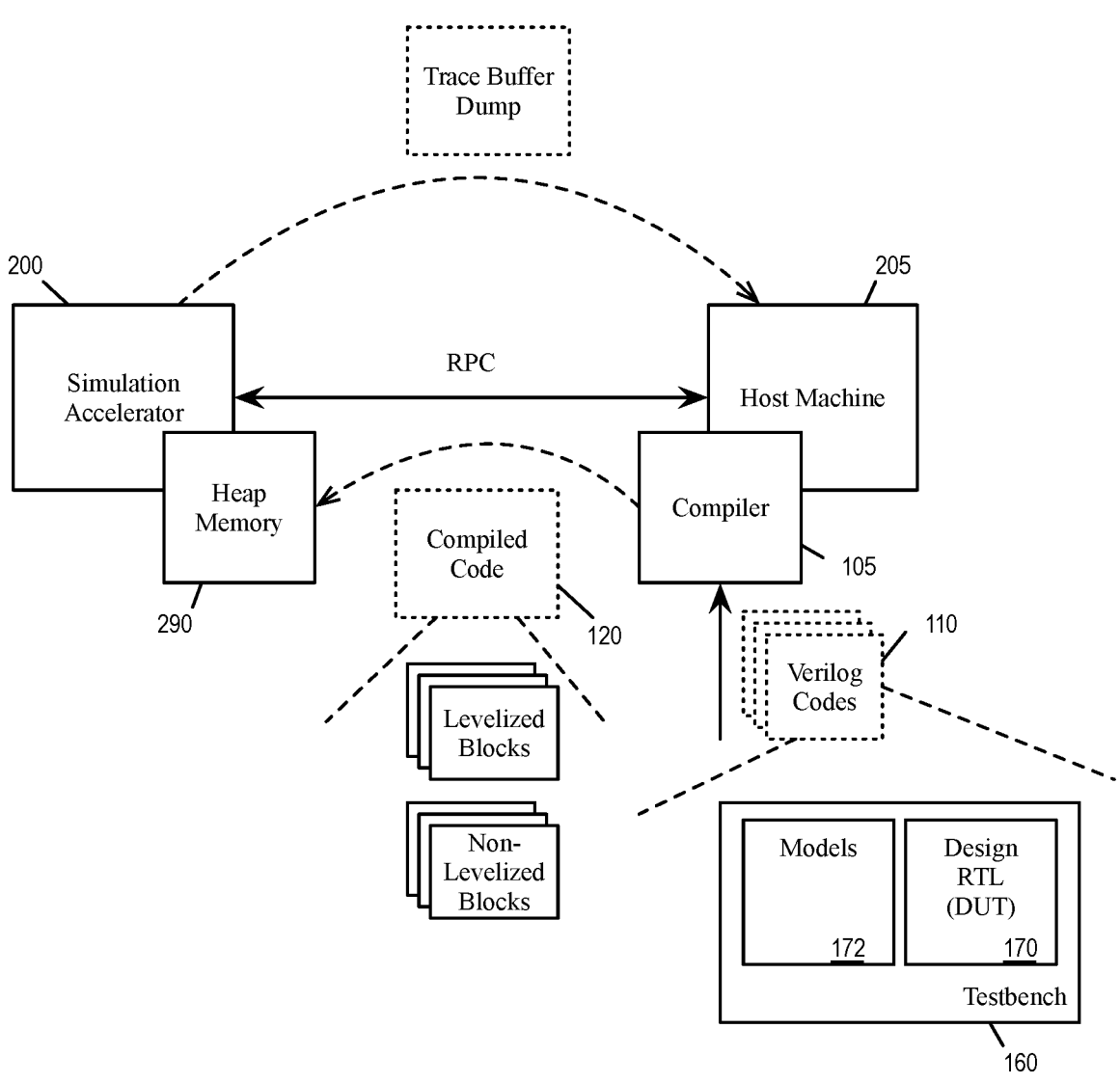
FIG. 1 conceptually illustrates a simulation acceleration system 100 for some embodiments of the disclosure.

FIG. 1 conceptually illustrates a simulation acceleration system 100 for some embodiments of the disclosure. As illustrated, the simulation acceleration system 100 includes a simulation accelerator 200 that is controlled and monitored by a host machine 205. The host machine 205 also provides a compiled image of codes, program, or data structures for execution by the simulation accelerator 200. In some embodiments, such codes, program, or data structures are generated by a compiler 105 that converts source codes 110 into compiled codes (or compiled design) 120 that are executable by the simulation accelerator 200. In some embodiments, the compiler 105 runs as an application on the host machine 205. The host machine 205 delivers the compiled code 120 to a heap memory 290 (or main memory) that is accessible by the accelerator 200.

In some embodiments, the simulation accelerator 200 is an electronic system or computing device that is implemented by one or more integrated circuits (ICs), such as application-specific ICs (ASICs). In some embodiments, the components of the simulation accelerator 200 is implemented on one or more PC boards, and the simulation accelerator 200 is also referred to as "the board". In some embodiments, the heap memory 290 includes memory devices (e.g., DRAM, SDRAM, etc.) that are components of the board or built into an IC that implements the accelerator 200. In some embodiments, the heap memory 290 includes storage capacity outside of the accelerator 200.

The source code 110 is written in a hardware description language (HDL) such as SystemVerilog or VHDL. The source code 110 is that of a testbench for simulating a digital design, or DUT (device under test). A testbench is a virtual environment used to verify the correctness of a design or model of a digital circuit or a set of digital circuits. The testbench 160 specifies a virtual environment for testing a design 170 of digital circuits. The testbench 160 can be viewed as including the design 170 and models 172. The design 170 includes descriptions of behaviors and/or structures of a digital circuit or of a set of digital circuits being engineered. The models 172 are models of the testing environment that provide stimulus to the design 170. The testbench 160 can also be viewed as including synthesizable codes and programs. The synthesizable codes (also referred to as RTLs) are codes that can be synthesized into digital circuit elements such as gates and/or transistors. The programs are codes that cannot be translated into digital circuit elements, but can nevertheless be executed to perform operations within the testbench 160. In some embodiments, the testbench 160 may also include simulation interface codes such as VPI or PLI commands.

The compiled code 120 includes executable instructions that are compiled from the testbench 160 (including the design RTL 170). The executable instructions of the compiled code 120 are organized into function blocks. A function block is a group of instructions that are to be executed sequentially as a unit by the same processor core or thread in the accelerator 200. When a block is processed by a processor core, the instructions of the block are loaded into the instruction cache and the data associated with the block are loaded into the data cache of the processor core.

In some embodiments, the blocks of the compiled code 120 can be grouped into two categories: levelized and un-levelized blocks. Levelized blocks are statically sorted into levels (during compile) such that blocks sorted into the same level do not have logical dependency with each other and can be executed in parallel. An example of such static sorting is group sort, which is described in U.S. Pat. No. 10,565,335, titled "Event-Driven Design Simulation", issued on Feb. 18, 2020. U.S. Pat. No. 10,565,335 is herein incorporated by reference.

Un-levelized (or non-levelized) blocks are blocks of the compiled Verilog code that cannot be levelized, e.g., cannot have their logical dependencies be statically determined. For some embodiments, a block is processed as an un-levelized block if any of the following is true: (1) The block contains any type of delay. (2) The block contains a task or function call, including DPI calls. (3) The block contains a system task/function call, including PLI calls. (4) The block contains a fork-join. (5) The block accesses any dynamically computed addresses, including an array access, class member access, etc.

In some embodiments, levelized blocks are not processed as transactions while un-levelized blocks are processed as transactions. The accelerator uses ALUs or processors that support noncoherent read and write instructions so that levelized blocks can be processed without using cache coherency so memory access latency can be reduced. In some embodiments, the simulation accelerator does not execute un-levelized blocks in parallel with levelized blocks.

The accelerator has an efficient memory system that avoids or minimizes the negative impact of high latency read operations (also referred to as "wild reads.") In some embodiments, the accelerator has dedicated instruction and data memory systems to reduce the cost of wild reads when they do happen. For example, in some embodiments, the accelerator does not have a memory management unit (MMU) or translation look-aside buffer (TLB) to support virtual memory, so there is no time lost due to TLB misses. The system is not virtualized (like a cloud server), so fewer steps are required to complete a memory access.

In some embodiments, the accelerator includes dedicated scheduler hardware. Scheduling is the handling of the queues of threads awaiting dispatch or event wakeup. It is empirically determined that roughly 30-50% of simulation time is spent in a pure software simulation dealing with thread scheduling and event processing. Traversal of these queues may involve wild reads and can slow the performance significantly. The accelerator system offloads these tasks to a dedicated scheduler unit. The scheduler unit is configured to process more than one scheduling request simultaneously such that it can remain busy performing useful tasks even if some requests are held up by wild reads.

In some embodiments, the accelerator achieves execution parallelism by having multiple processing units that are coordinated through a hardware transactional memory (HTM) system. HTM allows user code to be scheduled without having to actively prevent data hazards (e.g., conflicting memory location accesses) by having each user thread run in a memory transaction. If a data hazard is discovered for a memory transaction, the transaction rolls back and can be retried sequentially to avoid the hazard. HTM allows testbench code with dynamic data dependencies to run in parallel even when static analysis cannot prove that hazards cannot occur. By using memory transactions, running simulation with N cores is expected to achieve near N-fold speedup, even for testbench code having dynamic data dependencies.

In some embodiments, certain blocks are recognized by the scheduler as being preferred for sequential execution. In some embodiments, sequential execution is determined to be more efficient for a block if there is a high probability that the block will abort if it is run in parallel either due likely memory collision, cache size, or executing system tasks which cannot be undone. In some embodiments, the compiler identifies certain blocks as being preferred for sequential execution by static analysis of the design. In some embodiments, this is dynamically determined during simulation (by the compiler or a software simulator) using a learning algorithm.

In some embodiments, the accelerator system includes an active prefetch mechanism. Specifically, each processor has a prefetcher located at the interface to the memory buses. When the processor requests work from the scheduler, the returned work description is accompanied by a set of address/length ranges representing memory that is statically known to be accessed by the work item. The prefetcher fetches those memory regions into the instruction and data caches of the processor, and the work is permitted to be executed only when the prefetches are complete. A prefetcher can prefetch multiple units of work concurrently, so that the cost of a wild read can be hidden. Once a work unit is actually dispatched to the processor, the caches are "hot" so no static wild read overhead occurs.

In some embodiments, the performance of the accelerator is further improved by employing 4-state ALUs to perform Verilog four-state ('1', '0', 'Z', 'X') operations. The simulation acceleration system provides a 4-state instruction set, which allows the accelerator hardware to run these operations in a single clock cycle, while requiring less code space to represent. This is an improvement over conventional x86 implementations of these operations, which require 4-10 instructions per operation and have data dependencies that limit superscalar execution.

A. Simulation Accelerator

Figure 2:
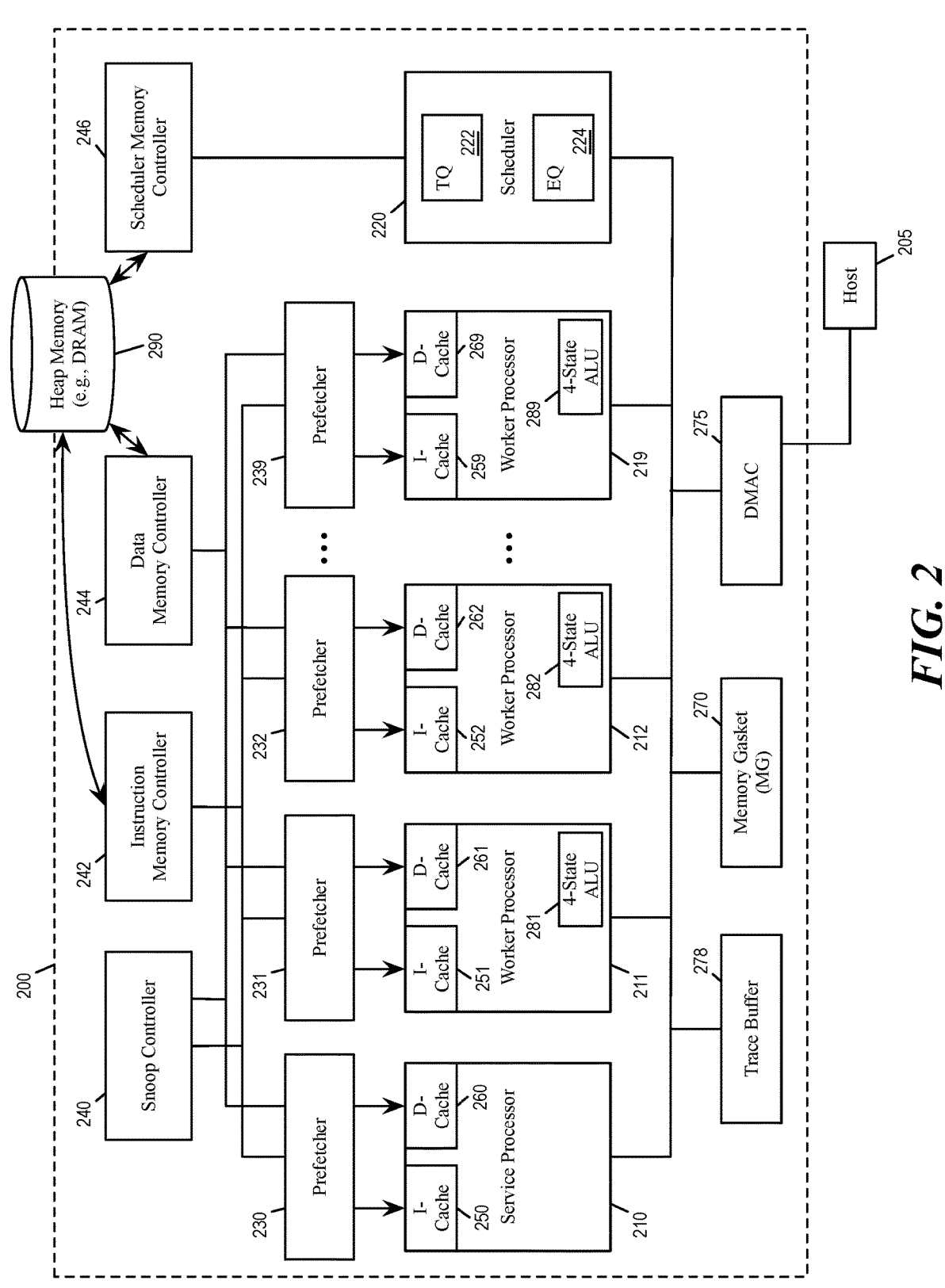
FIG. 2 conceptually illustrates simulation accelerator hardware of a simulation acceleration system.

FIG. 2 conceptually illustrates simulation accelerator hardware of a simulation acceleration system. As illustrated, the simulation accelerator 200 includes processor cores 210-219, a standalone scheduler 220, prefetch units 230-239, a coherent snoop controller 240, and memory controllers 242, 244, and 246 for the instruction stream, data stream and scheduler use.

The standalone scheduler 220 manages a time queue (TQ) 222 and event queues (EQ) 224. The simulation accelerator 200 also includes a memory allocation gasket 270 to mediate requests for memory allocation by different processor cores, a DMAC 275 (direct memory access controller) to manage interactions between the accelerator and a host machine 205, and a trace buffer 278 to hold waveform dump data. The coherent snoop controller 240 manages the data caches of each of the cores. The cores will use a MESI coherence protocol to implement hardware transactional memory.

In some embodiments, the modules 210-278 are modules of hardware circuits implemented by one or more integrated circuits (ICs) of an electronic apparatus implementing the simulation accelerator 200. In some embodiments, the modules 210-278 are modules of software instructions being executed by one or more processing units (e.g., a processor) of a computing device implementing the simulation accelerator 200. Though the modules 210-219, 220, 230-239, 240, 242, 244, 246, 270, 275, and 278 are illustrated as being separate modules, some of the modules can be combined into a single module.

Each processor core also has its own instruction cache and data cache. The prefetch units 230-239 connect between the scheduler 220 and the processor cores 210-219. The prefetch units 230-239 load data into the instruction and data caches of the respective corresponding processor cores prior to submitting work to each core. (The processor core 210-219 have corresponding instruction caches 250-259 and data caches 260-269, respectively.) At least some of the processor cores are equipped with 4-state ALUs to support computation in Verilog 4-state (logic high '1', logic low '0', unknown 'X', and tristate 'Z'). In the figure, the cores 211-219 are equipped with ALUs 281-289, respectively. 4-state ALU will be further described in Section H below.

In some embodiments, each processor element or core is a 64-bit RiscV core that supports at least some of the following standard extensions: atomic memory instructions, standard integer instruction set, Integer multiplication and division instructions, Single-precision floating-point, Double-precision floating-point, and Compressed instructions (some 32-bit standard instructions can be represented using 16-bit codes.) For some embodiments, 64-bit support is used because any simulation large enough to warrant execution on the special-purpose hardware such as the simulation accelerator 200 will likely require more than 4 GB of memory.

In some embodiments, the simulation accelerator 200 does not implement certain common "high performance" features in order to reduce the area and power of a processor core, and possibly be able to put more cores on a same chip. For example, in some embodiments, the simulation accelerator does not implement memory management unit (MMU), or transaction look-a-side buffer (TLB) or table walks to reduce memory system latency and improve performance. In some embodiments, the simulation accelerator does not implement superscalar execution since the processor is memory limited and will not benefit from superscalar execution. In some embodiments, the simulation accelerator does not implement branch prediction, since most System-Verilog RTL code has no loops, branch prediction is likely not useful. In some embodiments, the simulation accelerator does not implement out-of-order execution nor interrupts.

In some embodiments, the simulation accelerator 200 implements its CPU cores 211-219 as "barrel processors", e.g., each core maintains states for multiple independent software contexts, and time-multiplexes among them. This allows memory access latencies to be covered even when out-of-order execution or branch prediction is not implemented.

In some embodiments, one of the processors of the simulation accelerator 200 is configured as a "service processor". In some embodiments, each processor hardware thread (hart) is assigned a numeric ID, and the service processor is assigned Hart ID 0. Unlike the other processor cores, the service processor may have out-of-order execution features, but no 4-state ALU. In some embodiments this core would be used for "heavy" tasks such as constraint solving or coverage collection, system tasks such as garbage collection, and coordination with the hardware scheduler, but not RTL. In the example of FIG. 2, the processor core 210 is a service processor with Hart IDO and without a 4-state ALU, while the processor cores 211-219 are worker processors with 4-state ALUs.

The service processor manages all bookkeeping operations of the system, including garbage collection, memory replenishment, etc. The service processor may not have the same architecture as the other processors. For example, it may be out-of-order or superscalar, to better perform some tasks. Conversely, the service processor may not have all of the extensions that the worker processors do, for example, in some embodiments, the service processor does not have or implement a 4-state ALU. The remaining hart IDs 1-N are allocated to the worker processors, which run the user code. These processors are designed to be compact to allow multiple instances in the system. Hart ID 1 is special in that it will run all "single-threaded" code in the event of a transaction abort or a specifically requested sequential execution. However, its hardware is no different than that of the other worker processors.

The scheduler unit 220 services requests from the processor elements 211-219. Each request is in the form of a message sent from a processor to the scheduler 220. When the processor has an active memory transaction in progress, a scheduler request by the processor may be held in a per-processor FIFO called a deferred queue. The FIFO contents are forwarded to the scheduler 220 only if the transaction commits; otherwise they are discarded. It is possible to exhaust the request FIFO while a transaction is open; doing so will cause the transaction to abort and FIFO contents to be discarded. A number of scheduler specific instructions are available. These scheduler instructions will be further described in Section D below.

A prefetch unit (e.g., prefetcher 231) between the scheduler 220 and each processor (e.g., processor 211). The prefetcher of a processor prefetches memory for the processor as required to minimize memory latency due to cache misses. The prefetchers will be further described in Section B below.

The memory allocation gasket 270 includes a set of FIFOs of free memory blocks, one FIFO for each range of supported sizes. Threads can pop memory blocks from the FIFO without otherwise mutating global state. If a FIFO runs low then the service processor 210 will be awakened to allocate memory and replenish the FIFOs in question. Memory allocation gasket will be further described by reference to Section E below.

The DMAC 275 manages the communication between the host 205 and the board 200, which requires a socket-like connection to transfer buffers containing RPC messages. The DMAC 275 manages this message transfer and interacts with the processor cores 211-219. The scheduler 220 receives requests for new RPC calls and sends RPC replies back to the caller. RPC mechanism will be further described in Section F below. In some embodiments, the SystemVerilog design (RTL+testbench) will be compiled on the host machine 205 by a compiler program. In some embodiments, the host machine 205 is based on a x86 processor, and the compiler generates compiled code targeting a RiscV. The compiler program passes that image to the board 200 and manages the host side of all RPC communications, including interaction with DPI and VPI libraries.

The instruction memory controller 242, the data memory controller 244, and the scheduler memory controller 246 are independent memory controllers that each access the heap memory 290. The instruction memory controller 242 provides the instruction stream for all processing elements. The data memory controller 244 provides the data store for the processing elements. The scheduler memory controller 246 provides storage for the TQ 222 and the EQ 224. The data memory provided by the data memory controller 244 is a transactional memory. Memory transactions permit all-or-nothing semantics to be applied to an instruction sequence, thereby allowing for dynamic parallelism, and parallelism between blocks whose non-interference cannot be statically proven. The memory system of the simulation accelerator will be further described in Section C below.

B. Prefetcher

Figure 3:
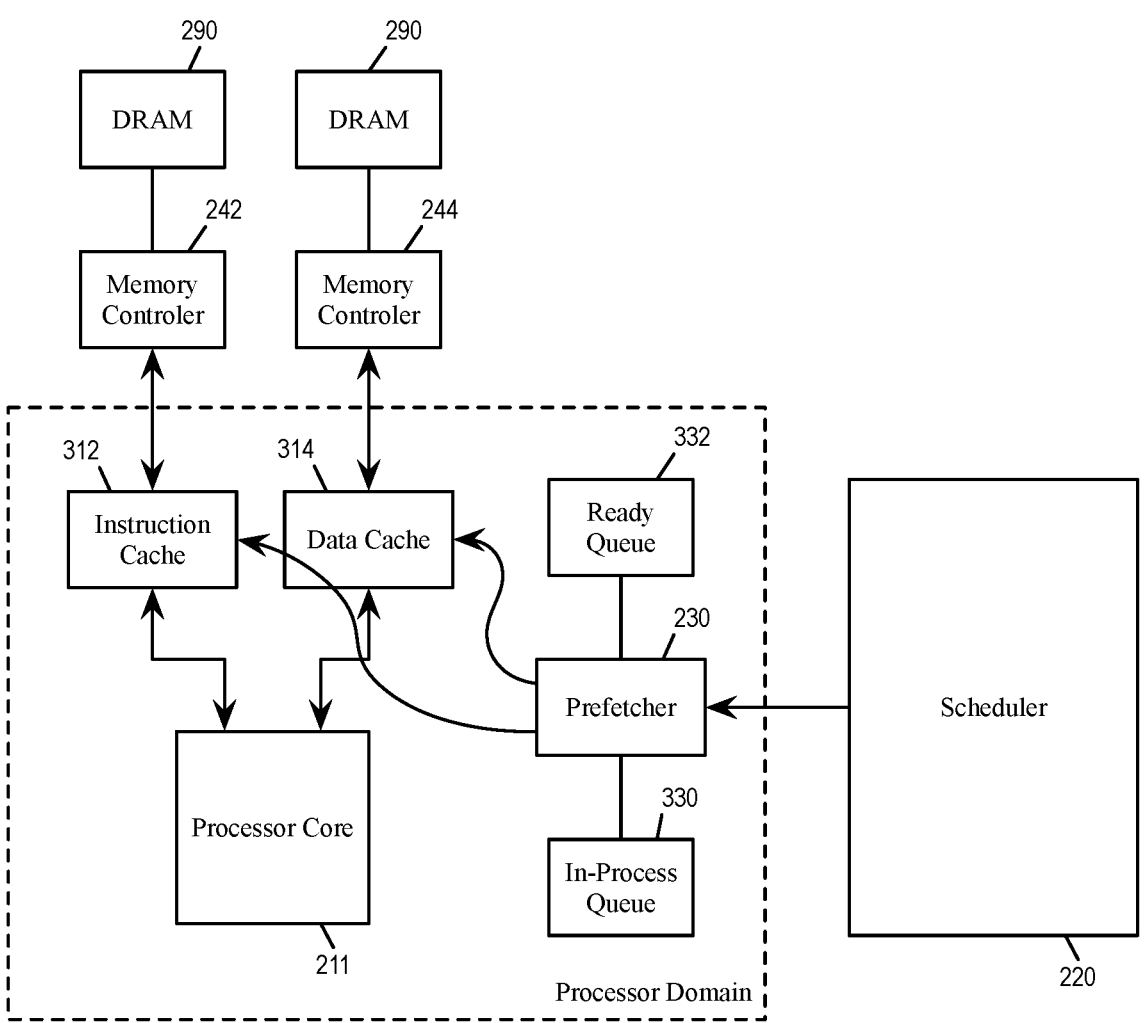
FIG. 3 conceptually illustrates a prefetcher that prefetches instructions for a processor.

In some embodiments, each physical CPU core implementing the simulation accelerator has a corresponding prefetcher. The prefetcher intercepts work requests issued by the scheduler and prefetches relevant data, so that no memory latency is observed by software. FIG. 3 conceptually illustrates a prefetcher that prefetches instructions for a processor.

As illustrated, the prefetcher 230 maintains two internal queues of work (or prefetch requests). A first queue (in-process queue 330) is for work that is in the process of being prefetched. A second queue (ready queue 332) is for work that is prefetched awaiting execution. Upon completion of a prefetch, the prefetched work is removed from the in-process queue 330 and moved to the ready queue 332.

The core 211 (a worker processor) asks for work from its prefetcher 231, and the prefetcher 231 asks for work items from the scheduler 220. The prefetcher 231 pre-populates the caches (instruction cache 312 and data cache 314) of the core 211 with memory content (from the instruction and data memory controllers 242 and 244) that are needed by the work item. The work item is handed off to the core when the caches are done being populated. The prefetcher 231 may ask for more pieces of work (so there can be multiple pieces of work in-flight) before a current piece of work is complete.

Figures 4A, 4B:
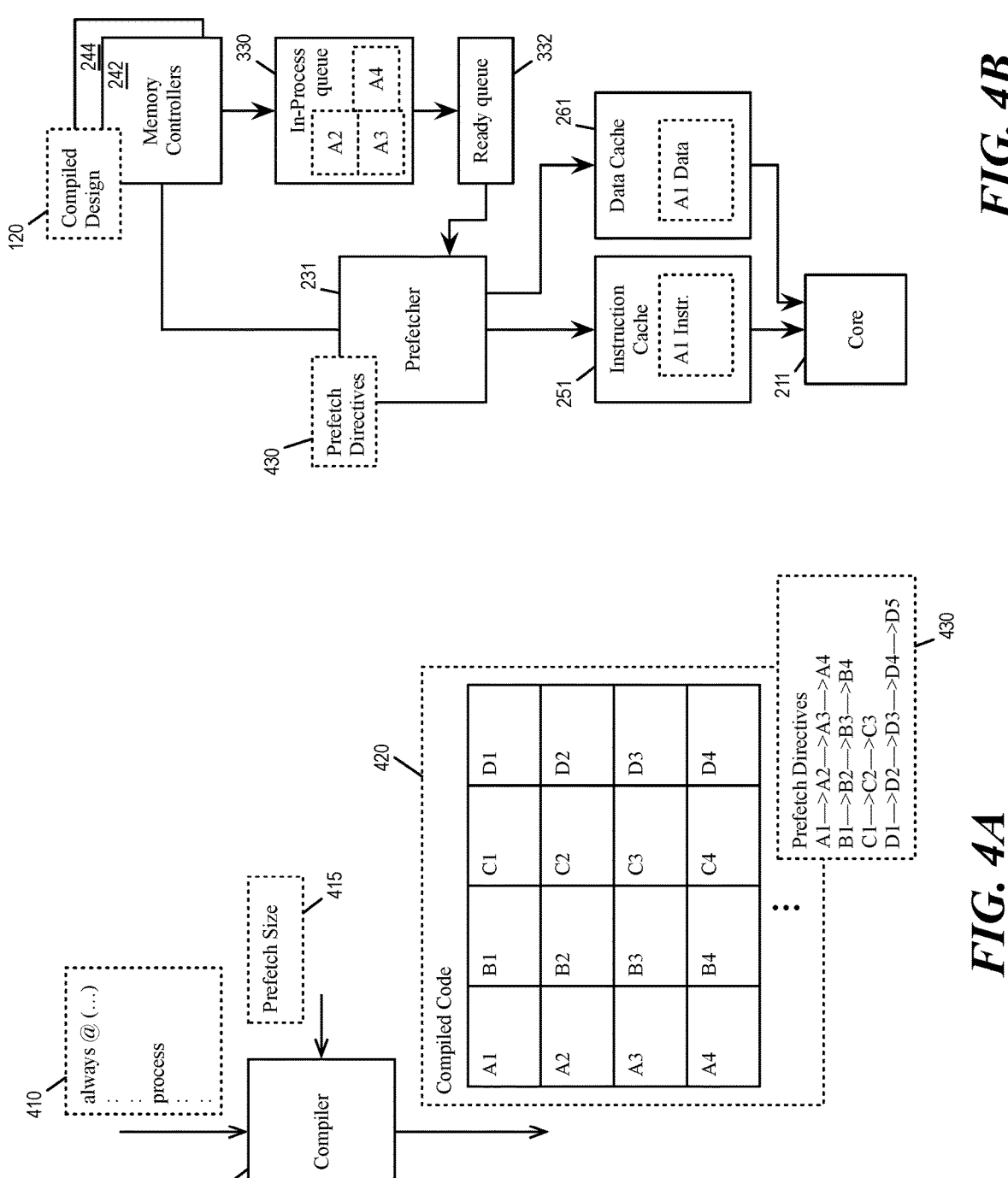
FIGS. 4A-B conceptually illustrate the prefetcher fetching pieces of a task for a thread or processor core according to prefetching directives provided by the compiler.

In some embodiments, the compiler for the simulation accelerator statically analyzes the source HDL (e.g., Verilog) code to predetermine which data/instructions can be prefetched for a piece of work for a thread. For dynamic work or thread that are not identified by compiler, the accelerator will fetch data and/or instruction from the heap memory and incur latency. FIGS. 4A-B conceptually illustrates the prefetcher fetching pieces of a task for a thread or processor core according to prefetching directives provided by the compiler. In some embodiments, the compiler determines the prefetching directives based on relationships between logical blocks in the source code. The simulation accelerator identifies one or more prefetch sections according to the prefetching directives and prefetches the identified prefetch sections for the processor. In some embodiments, when the accelerator prefetches a set of instructions that falls within a prefetch section from the instruction memory, a corresponding set of data (e.g., data that are statically determined to be accessed by the instructions in the prefetch section) is also prefetched from the data memory.

As illustrated in FIG. 4A, the compiler 110 compiles HDL (e.g., Verilog) source codes 410 into compiled codes 420 or instructions for execution at the simulation accelerator 200. The HDL source codes 410 includes both RTL and TB components. The compiler also partitions the compiled code 420 into prefetch sections that can each fit into the instruction cache of a processor core of the accelerator. The size of the compiled code 420 is expected to be far larger than the capacity of the instruction cache of any individual processor core. (For example, the caches of the processor cores of the accelerator are expected to be as small as 1 MB.)

In the figure, the compiled code 420 includes prefetch sections that are labeled "A1", "A2", "B1", "B2", etc. In some embodiments, the size of each prefetch section is limited by a "prefetch_size" parameter.

The compiler also analyzes the HDL source code 410 to determine a set of prefetch directives 430. The set of prefetch directives is determined based on the static relationships within the HDL source code 410, specifically within and among RTLs. FIG. 4B conceptually illustrates the prefetcher 230 using the prefetch directive to prefetch instructions from the instruction memory 242. In the example, the prefetch directive 430 directs the prefetcher 430 to prefetch the prefetch sections "A2", "A3", and "A4" from the heap memory 290 into its in-process queue 330, while the core 211 is executing codes from prefetch section "A1". Once all the instructions in the prefetch directive have been prefetched the prefetcher moves the entry from the in-process queue 330 to the ready-queue 332.

Different embodiments of the accelerator may use different schemes to implement the prefetch directive 430 and to define prefetch sections. In some embodiments, each processor core has an activation record (AR) for holding pointers for various processes and data structures. The AR also has fields for storing prefetch size (in terms of number of cache lines) for AR and cache register and defines IR prefetch section. In some embodiments, a prefetcher prefetches five types of prefetch sections: (1) The AR itself. The prefetcher prefetches at least 64 bytes for AR as the AR header contains the prefetch configuration. (2) The function to execute (or instruction text): 64 bytes (one cache line) are prefetched. After that point, the regular instruction prefetching mechanism takes over to perform additional prefetching. (3) The CR. The AR indicates the total number of lines to prefetch. (4) Up to two prefetch sections of the IR. Each prefetch section is described using 32 bits that includes 24 bits for the offset and 8 bits for the length. If the length field is zero then no IR prefetching occurs for the given prefetch section.

In some embodiments, the scheduler advertises the existence of two types of work to the processors, and the prefetcher makes the decision to prefetch or not based on the type of work. Specifically, the prefetcher will not prefetch non-AR work created by sch_spawn instruction. The prefetcher may on the other hand prefetch AR-based work dispatched as a result of executing a prefetch section. In some embodiments, the existence of each type of work is conveyed separately When the scheduler advertises AR-based work, and if the in-process queue and ready queue are not full, then the prefetcher accepts a unit of AR-based work and issues a prefetch for one cache line of AR. Upon completion of the AR prefetch, the prefetcher issues prefetches for other prefetch sections (supplementary AR, instruction text, supplementary CR, and up to two IR prefetch sections).

When the processor core requests work, and if any item exists in the ready queue of the prefetcher, it is dispatched to the processor. Otherwise, if non-AR work is available, then the prefetcher will accept one unit and dispatch it.

C. Memory Systems

In some embodiments, the accelerator implements several logical memory controllers to implement several independent logical memory entities. Specifically, an instruction memory controller is used to provide the instruction stream for all processing elements. A data memory controller is used to provide the data store for the processing elements (the data memory is cache-coherent and/or transactional.) Two scheduler memory controllers are used to provide internal store for the scheduler, specifically one for the time queue (TQ) and another for the event queue (EQ). In some embodiments, each of these logical memory controllers may be implemented by one or more physical (DRAM) controllers to provide the required bandwidth. In some embodiments, the accelerator does not use memory management unit (MMU) for address translation in order to reduce memory access latency.

In some embodiments, memory supplied by each of the logical controllers resides in a unified 64-bit address space. For example, the instruction memory may occupy address locations, 0xc0de0000_00000000-0xc0deffff_ffffffff, the data memory may occupy address locations 0xda7a0000_00000000-0xda7affff_ffffffff, and the scheduler, which is split in two for TQ & EQ, may occupy address locations 0x5c4ed000_00000000-0x5c4edfff_ffffffff. In some embodiments, the address ranges are chosen to avoid the need for "blacklisting" in the garbage collector. (The garbage collector will "blacklist" any address range that is likely to be referenced by some data that is not actually a pointer. e.g., the address 0x00000001_00000000 would likely be blacklisted because it is indistinguishable from a structure whose first element is 0 and its second 1.)

In some embodiments, the address map provides a maximum of 256 TB for the instruction and data memory and 16 TB for the scheduler. The 64-bit address space and 64-bit processors are used to accommodate more than 4 GB of data memory, as required by large simulations that are expected to be running on the accelerator. A data fetch instruction from any of the processor elements may target any of the logical memory controllers.

In some embodiments, the instruction memory is cacheable, but not coherent. In some embodiments, the instruction memory is read-only to all processors. In some embodiments, the scheduler memories are cacheable, but not coherent, and the accelerator has no fine-grain mechanism to arbitrate between access from processor elements and accesses from the scheduler.

In some embodiments, processors do not access the scheduler memory during normal operations (e.g., when the processors are performing design simulation). The scheduler has exclusive access. Access to scheduler memory is permitted only during garbage collection, where the processors may read scheduler memory to detect collectable memory reachable only by scheduler data structures. Prior to garbage collection, the scheduler is paused. Once the scheduler has finished processing all commands in progress, it will acknowledge the pause, after which free access by the processors is permitted. Once garbage collection is complete, the scheduler can resume normal operations. In some embodiments, the scheduler memory is cacheable by the processors to permit efficient scanning of a cache line to look for pointers.

The data memory is cache-coherent and transactional, i.e., the data memory may contain actions that are in bundled as transactions, where actions within one transaction must all take place or not at all. Memory transactions permit all-or-nothing semantics to be applied to an instruction sequence, thereby allowing for dynamic parallelism, namely parallelism between blocks whose non-interference cannot be statically proven. Cache-coherent memory accesses are used to determine whether any read-write or write-write inconsistencies exist at a cache line granularity. Conflicting transactions are aborted, which prevents any effects from being seen globally. In some embodiments, a specialized snoop controller (e.g., snoop controller 240) is used to support this functionality. Conflicting transactions can be retried, perhaps sequentially. In some embodiments, part of the data memory can be reserved for thread stacks. The portion of the data memory that is in an address range reserved for the thread stacks is non-transactional, so that local spills/reloads do not require snoop operations. In some embodiments, certain other operations, such as scheduler requests, are deferred while a transaction is in progress. They are submitted when a transaction is committed.

In some embodiments, the transactional memory (TM) system is built based on the MESI (Modified/Exclusive/Shared/Invalid) coherence protocol. A cache line in a modified, exclusive, or shared state can be marked as being part of a memory transaction. When a memory transaction is in progress, memory accesses cause the following to happen: (1) Any new line fetched into the data cache is marked as being part of the memory transaction. (2) An existing line in shared or exclusive state is marked as being part of the memory transaction. (3) An existing line in modified state is first cast out to memory, then marked as being part of the memory transaction. The cast-out is required so that if the transaction aborts, modified data prior to the transaction is not lost when the line is invalidated. (4) When the transaction commits, all lines marked as being part of the transaction have their marks cleared. (5) If the transaction aborts, all lines marked as being part of the transaction are invalidated. Subsequent accesses will cause data to be fetched anew from memory. (6) If an external probe requests a line in shared state, and the line is shared and part of a transaction, then the line remains in shared state and the transaction remains in progress. (7) If an external probe requests a line in shared state, and the line is either modified or exclusive and part of a transaction, then the transaction aborts. The line is invalidated. The local cache controller responds to the probe as if the line were never present in the cache. This represents the case where another processor is attempting to read part of a transaction in progress. The transaction aborts to preserve atomicity. (8) If an external probe requests a line in exclusive state, and the line is part of a transaction (any state), then the transaction aborts. The line is invalidated. The local cache controller responds to the probe as if the line were never present in the cache. This represents a potential write-write conflict.

Figure 5A:
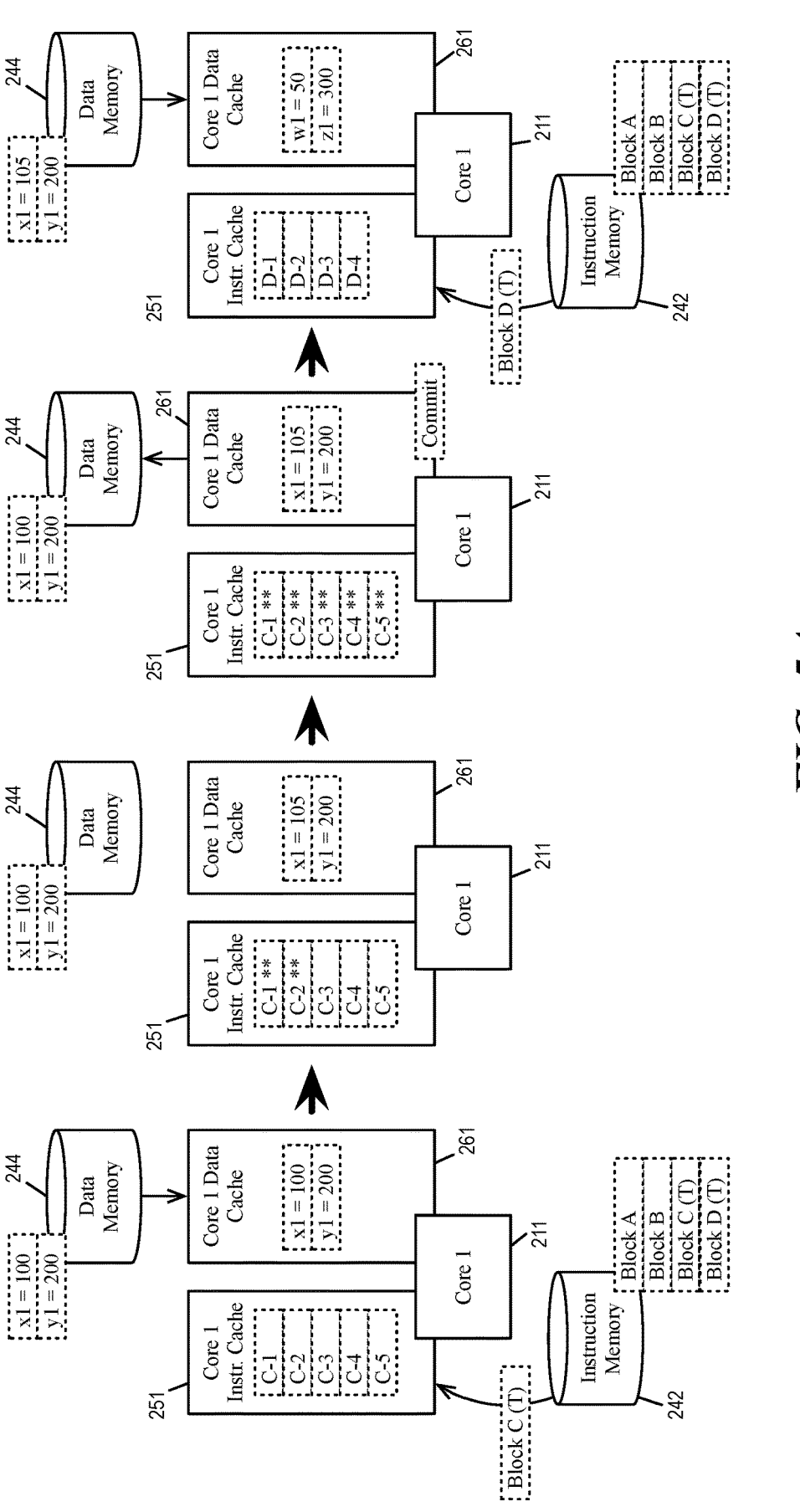
FIGS. 5A-B conceptually illustrate execution of memory transactions in the simulation accelerator.
Figure 5B:
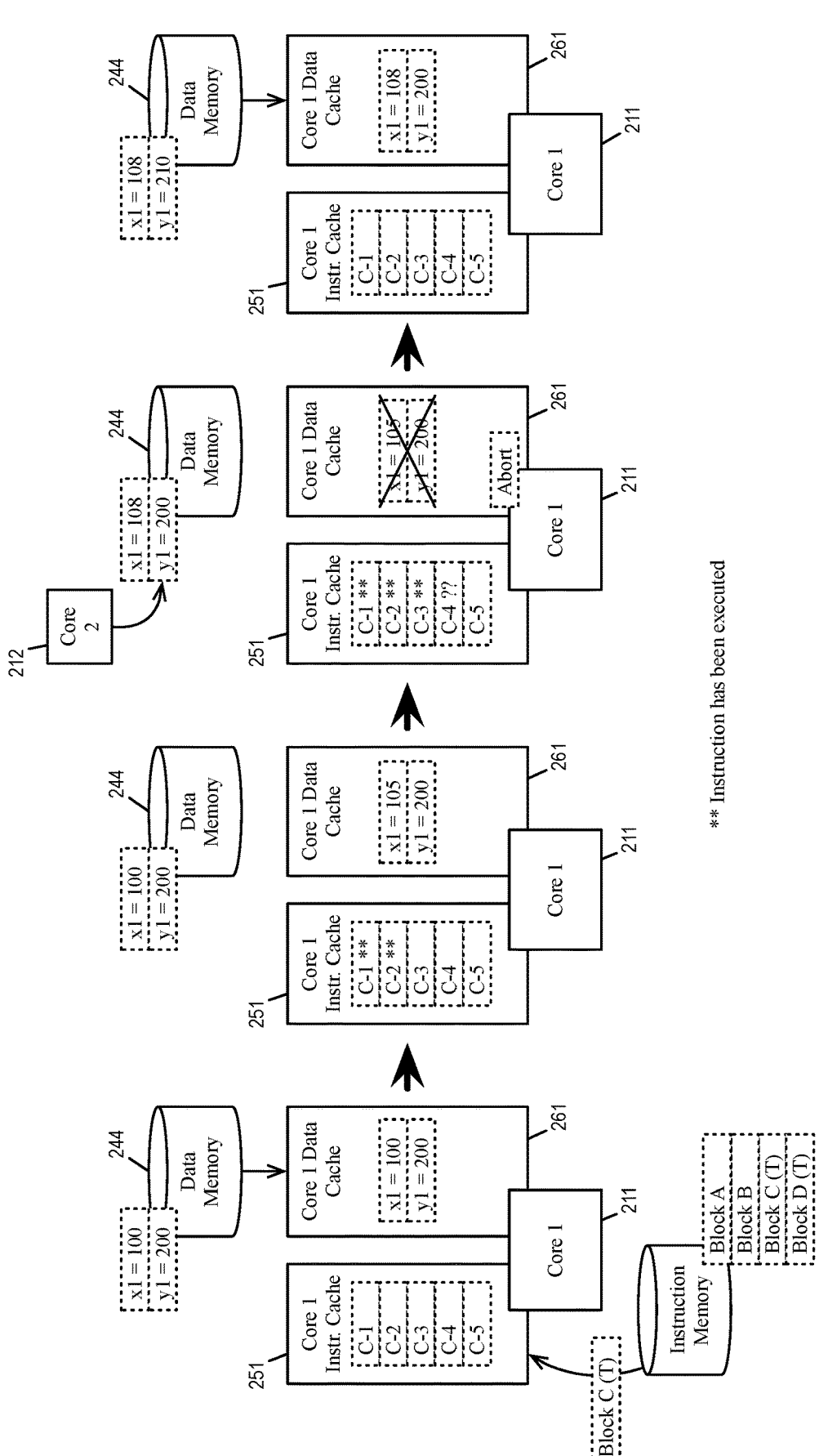

FIGS. 5A-B conceptually illustrate execution of memory transactions in the simulation accelerator. In the example, the instruction memory 242 stores instructions for several function blocks A, B, C, and D. Among these, blocks C and D are identified by the compiler to be run as transactions, while blocks A and B are not. A processor core (the processor core 211) is assigned work for the function block C. The execution of function block C involves reading and writing simulation data, including variables "x1" and "y1". The compiled code (stored in instruction memory 242) and the simulation data (stored in data memory 244) are both stored in the heap memory 290. The instructions of block C are fetched into the instruction cache 251 of the processor 211, while the simulation data of block C is fetched into the data cache 261 of the processor 211.

FIG. 5A shows the function block C successfully completing as a transaction. As the instructions of block C executes, the processor core 211 makes changes to the simulation data in the data cache 261 (the value of variable "x1" is changed from 100 to 105). The content of the data cache 261, including the changes that were made to "x1", is written to the data memory 244 as the transaction of block C commits. After completion of block C, the processor core 211 goes on to process another function block (function block D).

FIG. 5B shows the function block C failing to complete as a transaction and having to abort and rollback. In the example, the processor core 211 has made a change to the variable "x1" (from 100 to 105) in the simulation data in the data cache 261, while another processor core (the processor core 212) has also written to the variable "x1" (from 100 to 108). Thus, the transaction of block C has performed a write that is in conflict with another processor core. This conflict is detected (by the snoop controller 240), and the transaction of block C aborts and does not commit. The content of the data cache 261 of the processor 211 is dumped or purged, including the change that was made to the variable "x1". The core 211 restarts the transaction of function block C, with the simulation data from block C re-fetched or reloaded from the data memory 244, including the updated value of "x1" (108). In some embodiments, the aborted transaction is returned to the scheduler 220 via an instruction sch_enq_seq and the scheduler will put the transaction in a special queue to be run sequentially (e.g., a sequential queue 1230 of FIG. 12D) after all the other parallel work has been completed.

A memory transaction may abort for any of the following reasons: (1) the cache coherence protocol detects a read/write hazard. In addition to preventing two writes from two different transactions to the same cache line, the protocol also ensures consistent reads, that a thread's view of the external system state is a snapshot taken when the memory transaction starts, so that all user data structures are consistent. If another thread modifies memory such that consistency is violated, then the transaction aborts. (2) The program explicitly aborts the transaction with an mt_abort instruction. (3) The data cache is no longer able to retain transactional data, because all sets for a given cache line are full with transactional data, and caching of additional data is requested. (4) Any internal buffer (e.g., trace buffer, scheduler buffer) intended to provide full block activity transactionality overflows. (5) One of the scheduler instructions in a transaction is disallowed. (6) an RPC communication with the host is initiated. This cannot be rolled back so the transaction aborts before the connection is made.

For levelized blocks, each block reads some data from data memory, and writes results to fanouts located at different cache lines in data memory. Due to the group sort, write data cannot possibly conflict with any read data required by the group, as group sort is a static schedule that permits race-free coherency. In some embodiments, levelized blocks are not processed as transactions while un-levelized blocks are processed as transactions. In some embodiments, the simulation accelerator does not execute un-levelized blocks in parallel with levelized blocks. In some embodiments, each time simulation time step is divided into scheduling regions by the scheduler 220, and levelized blocks of different levels are scheduled to execute in different scheduling regions, while the un-levelized blocks are scheduled to execute in other scheduling regions.

Since levelized blocks do not require cache coherency to maintain consistency, the cache coherency mechanism can be bypassed when processing levelized blocks. In some embodiments, the accelerator uses ALUs or processors that support noncoherent read and write instructions so that levelized blocks can be processed without using cache coherency so memory access latency can be reduced. Specifically, a noncoherent read instruction will read a cache line from main memory, without first negotiating with the coherency controller, while a noncoherent write instruction will write directly to main memory. Data may be retained in the cache, but it always goes to main memory. Using these instructions, all levelized blocks may execute concurrently without incurring the overhead of the concurrency protocol. Specifically, during prefetch of a levelized block, noncoherent reads are used to fetch the data. After the levelized block executes, fanout data are written to one or more memory locations (e.g., as inputs to other blocks and at locations to minimize prefetching overhead) using noncoherent writes.

Figure 6:
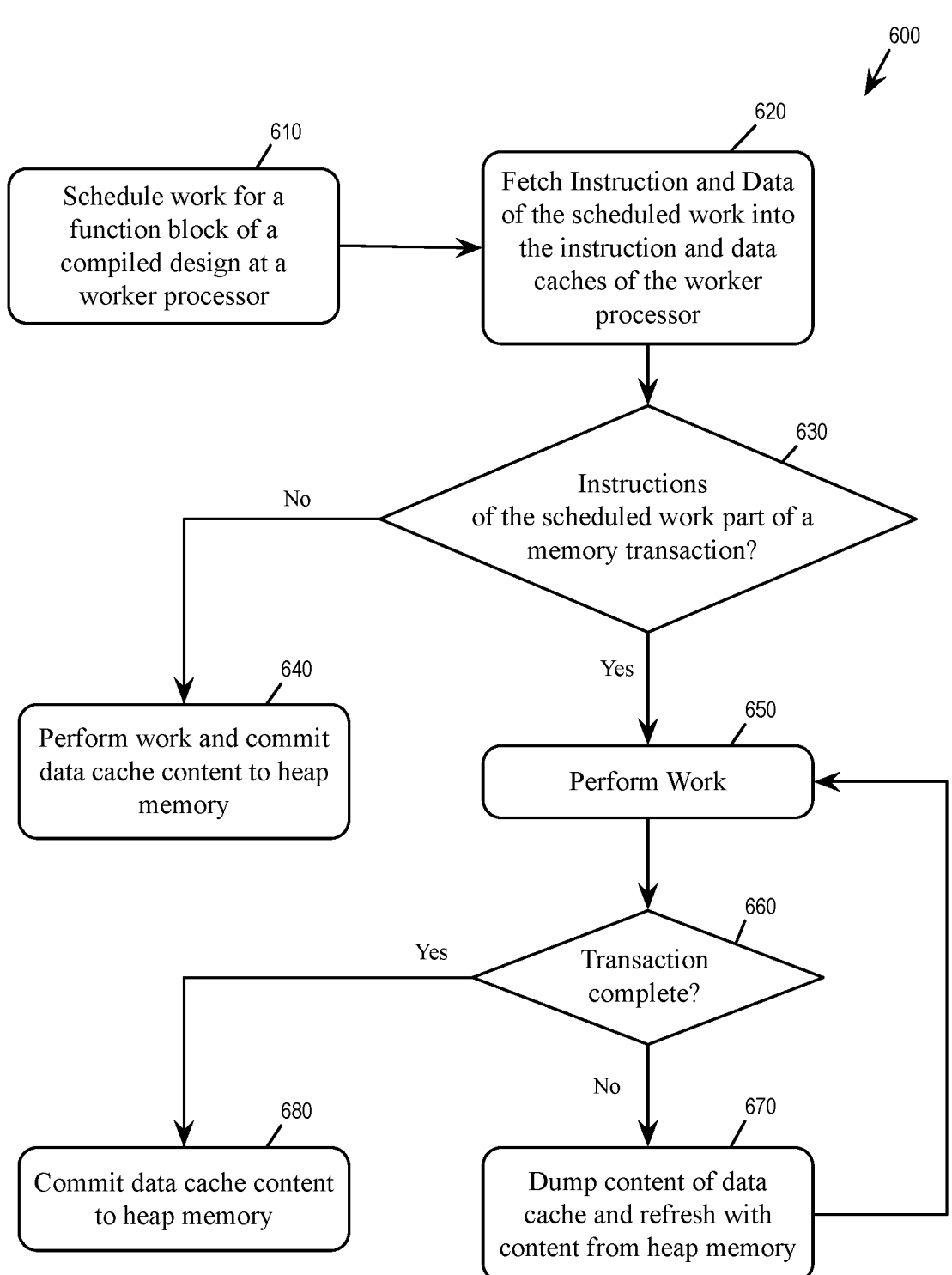
FIG. 6 conceptually illustrates a process for maintaining cache coherency in the simulation accelerator regarding memory transactions.

FIG. 6 conceptually illustrates a process for maintaining cache coherency in the simulation accelerator regarding memory transactions. In some embodiments, the simulation accelerator 200 performs the process 600. In some embodiments, one or more processing units (e.g., processor) of a computing device implementing the simulation accelerator 200 perform the process 600 by executing instructions stored in a computer readable medium.

The accelerator schedules (at 610) work for a function block at a worker processor. The scheduled work includes instructions from a compiled design (e.g., compiled code of a Verilog testbench). The compile design may include both levelized blocks and un-levelized blocks. In some embodiments, the accelerator does not schedule levelized blocks to be executed in parallel with un-levelized blocks, e.g., by scheduling all levelized blocks of a time step to be executed before any of the un-levelized blocks of the same time step or vice versa. In some embodiments, levelized blocks of a same level can be executed in parallel by different processor cores, but levelized blocks of different levels cannot be executed in parallel.

The accelerator fetches (at 620) instruction and data of the scheduled work from an instruction memory into the instruction and data caches of the worker processor. The accelerator determines (at 630) whether the fetched instructions are part of a memory transaction. In some embodiments, the compiler that generates the compiled design marks instructions of levelized blocks as not being part of any memory transaction, while instructions belonging to un-levelized blocks as belonging to memory transactions. If the fetched instructions are not part of a memory transaction (e.g., levelized), the process proceeds to 640. If the fetched instructions are part of a memory transaction (e.g., un-levelized), the process proceeds to 650.

At 640, the accelerator performs the work of the levelized block and commits the content of the data cache to the data memory.

At 650, the accelerator performs the work of the un-levelized block or memory transaction to the data cache without writing any simulation data content generated by the memory transaction to the data memory. The accelerator then determines (at 660) whether the memory transaction is successful, i.e., whether any of the abort conditions described above has occurred. If an abort condition has occurred, i.e., the memory transaction is not complete, the accelerator dumps (at 670) content of the data cache and refreshes the data cache with content from the heap memory before returning to 650 to perform the work. If none of the abort conditions has occurred, i.e., the transaction is complete, the process proceeds to 680 to commit the content of the data cache to the heap memory.

D. Scheduler

The scheduler block provides infrastructure for scheduling operations and inter-processor communications. The scheduler is shared by multiple different cores running different threads. The architecture is pull based, where worker processors and service processor request work from the scheduler rather than work being pushed from the scheduler out to the processors. Each processor core asks for work from its prefetcher, and the prefetcher asks for work from the scheduler.

In some embodiments, each hart (processor hardware thread) can request work from the scheduler (via the corresponding prefetcher of the processor) using a sch_next (scheduler next) instruction. If no work is available for the thread, then execution will block-waiting for a response (does not proceed until the response is received) from the scheduler until work becomes available. Specifically, the program counter is set to a function address provided by whatever scheduled the work. The target register of the instruction is set to an argument value provided by whatever scheduled the work. The stack pointer is set to a value configured in a control register. Execution then resumes with the first instruction of the requested function.

Figure 7:
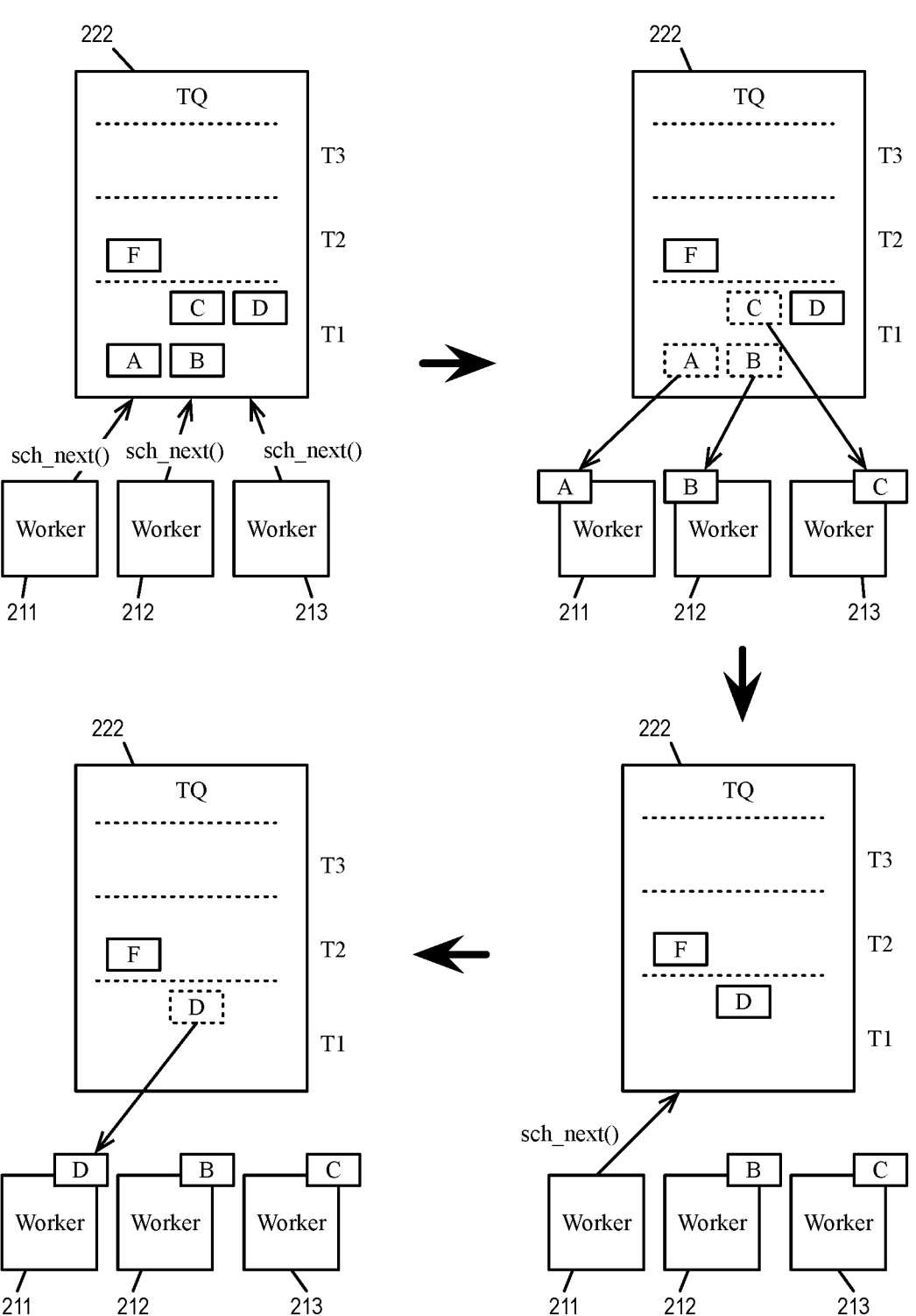
FIG. 7 conceptually illustrates processors of the accelerator requesting and receiving work from the scheduler.

FIG. 7 conceptually illustrates processors of the accelerator requesting and receiving work from the scheduler. As illustrated, the time queue 222 of the scheduler 220 stores objects that correspond to work that are scheduled to be performed at different time steps (and within different scheduling regions that sub-divide each timestep). In the example, work objects A, B, C, D are scheduled by the time queue 222 to be executed for time step T1, while the work object F is scheduled to be executed for time step T2. In some embodiments, each work object corresponds to an instance of a function block, or block instance, in the compiled design.

During simulation time step T1, the worker processors 211-213 each execute the sch_next instruction to request work from the scheduler 220. In response, the scheduler 220 assigns the block instance A to the processor 211, the block instance B to the processor 212, and the block instance C to the processor 213. When the worker process 213 completes work on for block instance A, it executes another sch_next instruction to request work from the scheduler 220 and is assigned block instance D. When all work objects of the time step T1 is complete, the scheduler would assign work objects of time step T2, etc.

As mentioned, the scheduler 220 has two main components: a time queue (TQ) 222 or TQ manager, and an event queue (EQ) 224 or EQ manager. The TQ manager 222 has two fundamental operations: insert a process (item of work) in a given scheduling region for some time step, and retrieve the next item of work for the current scheduling region. The EQ manager 224 is used to propagate notifications of value changes on signals. The EQ manager 224 has two fundamental operations: enqueue (a process about to sleep on an event, with future wakeup when its event is triggered) and wakeup (awaken a process sleeping in the queue). Awakened processes will be passed to the TQ manager 222 for execution in the next scheduling region of the same timestep, and to be dispatched to the worker cores.

In some embodiments, TQ and EQ each have a separate dedicated memory for their work items and neither can directly access the data memory of the processors. In some embodiments, a time queue manager divides each timestep into multiple (e.g., 64) scheduling regions (or time queue regions). All events in one scheduling region are processed before the simulator proceeds to the next region. The TQ manager processes each scheduling region within a time step by processing the scheduling region contexts or work objects and then moves on to the next scheduling region. Once all the scheduling regions are complete it moves on to the next timestep. There is the possibility of looping from a later region to an earlier one in the same timestep. Once all scheduling regions in a timestep have been processed, the simulation proceeds to the next timestep.

In some embodiments, block instances that are scheduled to execute in the same scheduling region may execute in parallel. Block instances that are scheduled to execute in different scheduling regions may have logical dependencies and cannot be executed in parallel. Some scheduling regions are levelized regions for scheduling levelized block instances and some scheduling regions are un-levelized regions for scheduling un-levelized block instances.

SystemVerilog scheduling algorithm divides or stratifies each time step into simulation regions (e.g., Preponed, Active, Re-Active, Postponed, etc.) according to the Verilog Language Reference Manual (LRM). In some embodiments, each SystemVerilog simulation region of a time step may map to one or more scheduling regions of the time queue for that time step. In some embodiments, at least some of the SystemVerilog simulation regions are divided into subregions. In some embodiments, levelized blocks of a same level may be assigned to a same subregion, while levelized blocks of different levels may be assigned to different subregions. Un-levelized blocks may be assigned to their own subregions. In some embodiments, each of these subregions may map to a scheduling region in the time queue. For some embodiments, this mapping is arbitrary and can be determined at compile time.

The scheduling regions of the TQ can be used to allow for a topological sort of RTL elements at a finer grain than required by SystemVerilog. The scheduler manages the SystemVerilog stratified regions event queue.

Figure 8:
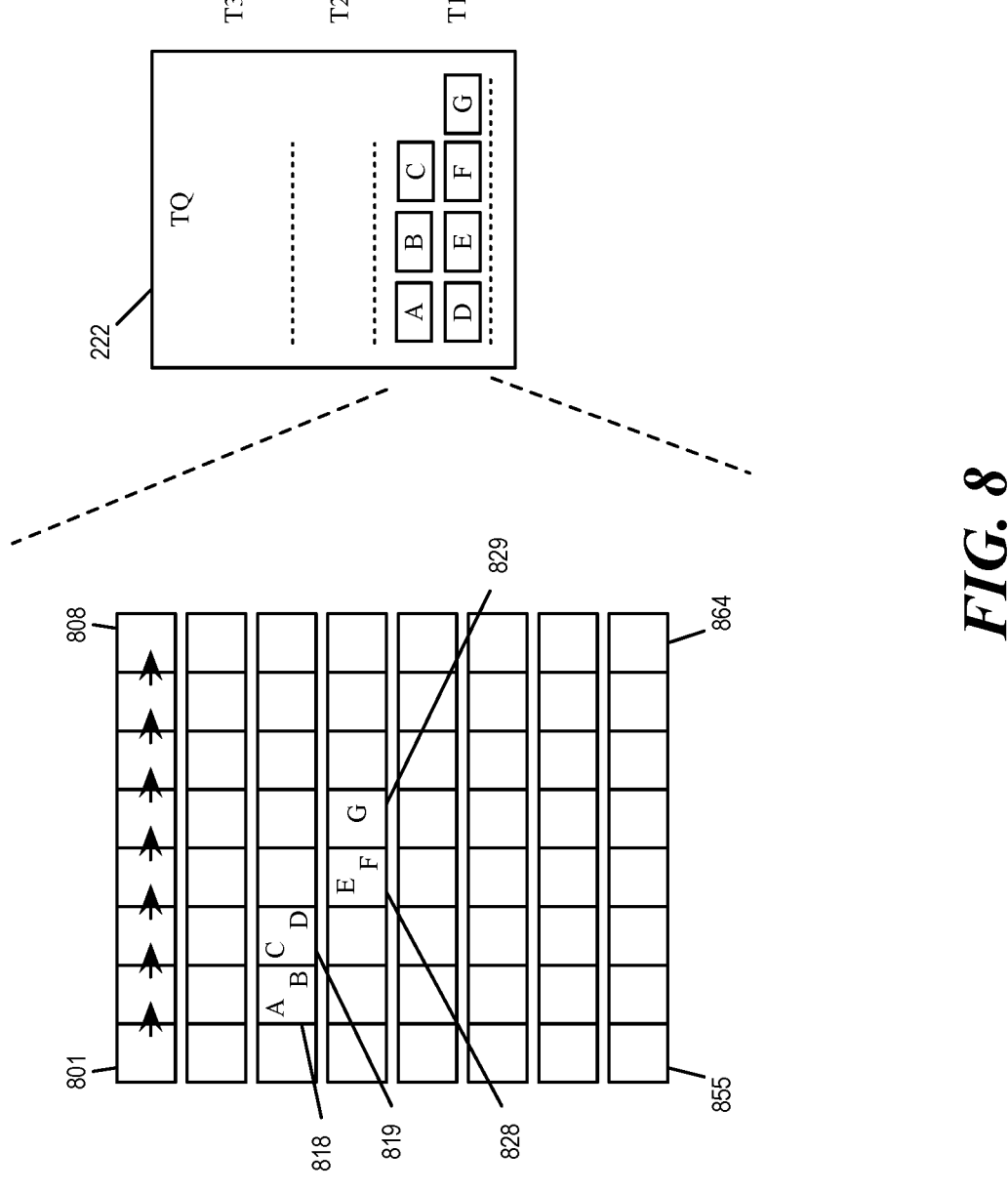
FIG. 8 conceptually illustrates a time step being divided into scheduling regions of the time queue.

FIG. 8 conceptually illustrates a time step being divided into scheduling regions of the time queue. The time queue 222 divides the time step T1 into up to 64 scheduling regions 801-864. The scheduler 220 will go through each scheduling region in order when dispatching work objects to be executed. In the example, the block instances A and B are scheduled to execute in scheduling region 818 and the block instances C and D are mapped to a subsequent scheduling region 819. The block instances A and B may execute in parallel as they share the same scheduling region, while the block instances C and D may execute in parallel as they share the same scheduling region. The block instances E, F, and G are scheduled to execute in later scheduling regions 828 and 829 as transactions.

In this example, the compiler has determined that blocks instances A and B as levelized blocks of a first level while the blocks instances C and D are levelized blocks of a second level that logically depend on the first level. The compiler therefore assigns the block instances A and B to the scheduling region 818 and the blocks instances C and D to the scheduling region 819 such that block instances A and B will be executed before block instances C and D. The compiler has also determined that blocks instances E, F, and G are un-levelized blocks and assign them to later scheduling regions 828 and 829 so they are not executed in parallel with any of the levelized blocks. The scheduling regions 818, 819, 828, and 829 may map to subregions of System-Verilog simulation regions.

In some embodiments, each work object managed by the time queue manager (e.g., the block instances of FIGS. 7 and 8.) requires a process context, which represents the state of the computation for that thread. For some embodiments, such a context is a data structure that is fundamentally a schedulable unit of work in the time queue and the event queues. Thus, block instances in the time queue 222 are stored as context objects To the worker/service processors, a context is identified by a context identifier, which can be seen as indexing into a context table in the time queue manager's local memory. In some embodiments, each context tracks (1) a function pointer to the compiled instructions that are to be executed to perform the work, (2) a pointer to the AR, or argument to the function, (3) the state of the context, or context state, which is one of FINISHED/RUNNING/WAITING/SUS-PENDED/KILLED/DISABLING to indicate whether the context exited normally, or is still running in some active queue, or waiting in a blocking statement, or suspended, or killed by user, etc.), (4) an indication of suspended state that is independent of the regular state (so that a context can be returned to its original state), (5) general-purpose flags for coordination with the event queue manager, (6) the current index used to match against the required index in event queues, and (7) linkage information linking contexts into a queue data structure.

The event queue manager implements event queues. Event queues are used to propagate notifications of value changes on signals, as well as other internal uses. The EQ manager provides a potentially unlimited number of queues. The event queue manager handles enqueue/dequeue and wakeup requests on event queues. Each event queue can be thought of as a queue of process contexts waiting for the associated event.

An event queue entry is a tuple of (context_idx, index, region, flag). Context_idx is the index of the TQ context that is waiting for the event. Index is the required index in the TQ context, which must match for the wakeup to occur; use of the index field allows the same context to enqueue to the same queue at multiple index points, representing multiple waits on the same item, e.g. multiple occurrences of @ (posedge clk) in Verilog. Region is the TQ region that the context is to be scheduled into upon wakeup. Flag is a pointer to a byte in user data memory. This byte will be set to 1 if the context is awakened. Flags are used by processes to determine which event from among multiple events generated the wakeup.

In some embodiments, the event queue manager of the scheduler provides for three different use cases: (1) Static Sensitivity, (2) Dynamic Sensitivity/Static Scope, and (3) Dynamic Scope. Static sensitivity applies when the item being waited on is located on a static path (no class handles, virtual interfaces, automatic variables, etc. on the path), or the expression being waited on refers to a simple variable, or the context doing the blocking is created at time 0 and persists throughout the lifetime of the simulation. Such contexts are initial/always blocks. For the static case, contexts enqueue themselves to event queues at time 0, and remain enqueued for the lifetime of the simulation. No new resources need to be allocated each time the context blocks.

Dynamic Sensitivity/Static Scope applies when the item being waited on is not located on a static path. It may contain a class handle or virtual interface. Alternatively, the expression being waited on may not be simple. However, the context doing the blocking is still a static scope (initial/always). This case requires that the context enqueue and dequeue itself each time it blocks and wakes up. However, any resources required to do so may potentially be allocated at time 0 prior to the first enqueue, and re-used for subsequent enqueues.

Dynamic Scope applies when the context doing the waiting is not an initial/always in Verilog. Rather, it may be a task or thread created from a fork-join block. In this case the blocking is truly dynamic: the context enqueue/dequeue itself from any event queues (as the task/fork thread will at some point cease to exist). In some embodiments, dynamic entries are handled as a doubly-linked list. The enqueue operation returns the list node as a "hint" that can be passed to the remove operation for efficient removal. This requires that the enqueue operation be able to return a result. However, scheduler operations that return a result are not permitted inside a memory transaction, as all scheduler operations are buffered until the transaction commits. A status register CSR contains the next unique hint or key. In some embodiments, the unique hint is read from the status register CSR and passed in the sch_eq_enq instruction.

For some embodiments, static and dynamic entries in the event queue have the same internal implementation, if it is determined that the event queue manager can efficiently deal with both in the same way. Static entries are arranged for efficient traversal, and dynamic entries are arranged for efficient enqueue/remove.

Figures 9A, 9B, 9C:
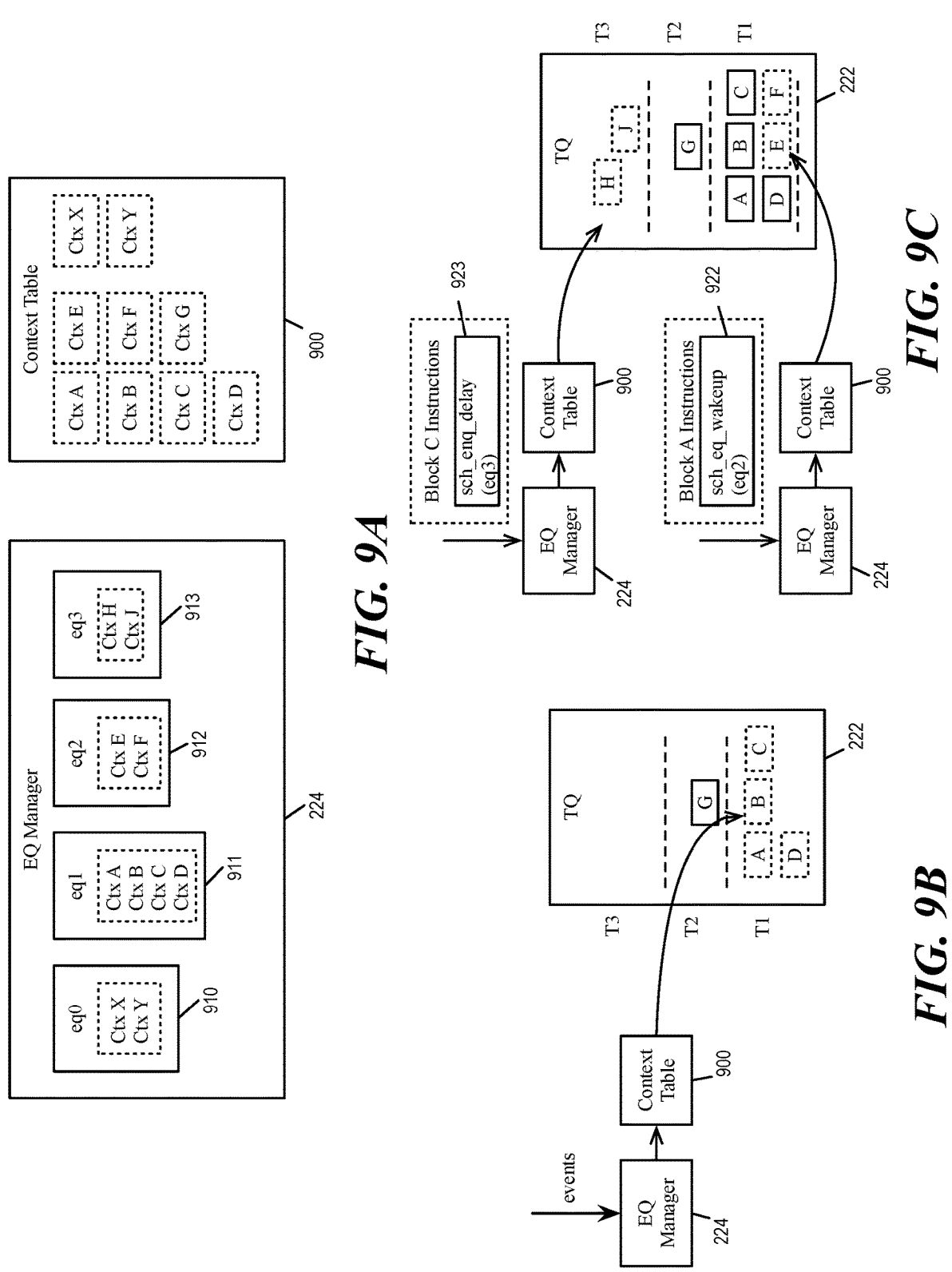
FIGS. 9A-C conceptually illustrate the scheduler using time queue and event queue to schedule work in the accelerator.

FIGS. 9A-C conceptually illustrate the scheduler using time queue and event queue to schedule work in the accelerator. As illustrated in FIG. 9A, the EQ manager 224 of the scheduler 220 manages several event queues (EQs), including EQs 910-913. The entries of the EQ 910 correspond to contexts for function blocks X and Y. The entries of the EQ 911 correspond to contexts for function blocks A, B, C, and D. The entries of the EQ 912 correspond to contexts for function blocks E and F. The entries of the EQ 913 correspond to contexts for function blocks H and J. The content of the different contexts are stored in a context table 900 of the time queue manager 222. Each EQ queues one or more entries that correspond to contexts for function blocks. Each entry is a tuple for identifying a context and for determining if the wakeup should move the context to the TQ for execution in the current region. When an EQ is awakened by a wakeup instruction (sch_eq_wakeup), the EQ manager 224 traverses the entries of the EQ to awaken the contexts identified by the entries. The context table 900 supplies the information of the identified contexts. The awakened contexts are then scheduled in the TQ 222 to be dispatched to the processor cores in the current simulation region.

FIG. 9B illustrates the EQ 911 being sensitized and block instances A, B, C, and D being scheduled into time step T1.

Blocks instances A, B, C, D are static entries that correspond to always/initial blocks in Verilog, which have static sensitivity. The contexts of A, B, C, and D are enqueued as EQ 911 at time 0 and remain enqueued for the lifetime of the simulation and may wake up to enter the TQ 222 based on sensitivity to specific events such as clock edges.

FIG. 9C illustrates a sch_eq_wakeup instruction 922 that awakens the EQ 912 (eq2), which causes contexts for block E to be added to the time queue for the current timestep T1. The wakeup instruction 922 is an instruction in function block A, so the execution of block A sensitizes or wakes up block E. The figure also illustrates a sch_enq_delay instruction 923 causing contexts for block H and J in EQ 913 (eq3) to be added to the time queue for a future timestep T3. The wakeup instruction 923 is an instruction in function block C, so the execution of block C sensitizes or wakes up blocks H and J.

In some embodiments, each SystemVerilog process (struct Process) that represents running code will point to a process context. This context is also pointed to directly by any AR that could execute a scheduler request. Software may perform task calls to propagate the context from one AR to another as required. The process context memory is visible to the service processor for the purpose of performing garbage collection, as the only reference to an AR may be in a process context. Garbage collection may occur between regions/timesteps so that the scheduler can be disabled so as to grant the service processor unfettered access to the scheduler memory.

In some embodiments, a small number of flags (e.g. 8) could be maintained per process context. The process context flags can be set by the time queue manager, and tested/cleared by user code using time queue instructions. The process context flags are used for (1) differentiating "simple" from "complex" sensitivity in Verilog sensitivity lists (for example, in always @ (posedge clk or cls_h.vif.signal, a flag is used to indicate that simple "posedge clk" has occurred, so that the complex expression need not be re-evaluated), (2) accelerating UDP (user defined primitives) processing (properly evaluating a UDP requires determining which edge out of many edges has occurred; flags are used to simplify the edge detection), (3) providing for a timeout on an event expression to determine if a wakeup was due to the event or due to a timeout.

In some embodiments, the service processor can schedule work to run on a worker processor using the sch_spawn (scheduler spawn) instruction. This instruction takes two arguments, representing the requested function and argument. The scheduler adds the requested work to a spawn queue (spawn_q) inside the scheduler where it will wait until a worker processor requests work. The spawn_q has the highest priority for workers so it will be dispatched to the next available worker when it calls sch_next. The service processor, meanwhile, continues to execute.

In some embodiments, worker processors can schedule work on the service processor using the sch_svc_req (schedule service request) instruction. The two register arguments specify the PC value and argument to run on the service processor. The scheduler adds the work to a service queue (svc_q), which is a queue solely for the use of the service processor. The work waits there until the service processor calls sch_next( ). In some embodiments, if the destination register is zero then a result is not expected and execution on the worker processor immediately continues. If the destination register is not zero then the worker processor will block waiting for a response from the service processor via the hardware scheduler sch_svc_ret( ) (service return) instruction call. The service processor can provide a result to a work processor using the sch_svc_ret( ) instruction. The first argument is the return value, and the second is the hart ID of the worker processor that issued the request. Behavior is undefined if the indicated worker processor is not blocked on a request. Although not a processor, the scheduler itself may also participate in the inter-process communication. Some scheduler instructions can be regarded as (possibly blocking) requests to the scheduler, and the scheduler itself can be a source of worker and service processor requests.

In some embodiments, scheduler instructions inside a transaction do not roll back transactions and do not take effect unless a transaction is committed. Scheduler instructions issued while a transaction is active may be added to a deferred queue on the (worker or service) processor which is only passed to the scheduler itself once the transaction has completed. In some embodiments, there are four types of scheduler instructions. The encoding of the scheduler instructions indicates the scheduler instruction type. The scheduler determines how to manage the instruction based on the scheduler instruction type. These four scheduler instruction types have different behaviors with regard to transactions and deferring. The four types of scheduler instructions are: (1) return no result, add to a deferred queue if in a transaction; (2) execute sch_next, return result, abort transaction, changes PC; (3) return result, abort if in a transaction; and (4) return result, and blocks the processor until value returned, but the instruction is allowed in transactions.

The following are instructions that request specific scheduler operations:

sch_alloc_proc( ). In some embodiments, the time queue manager maintains a free list of context structures. This instruction allocates a new context structure from the free list and returns it to the user. Each initial/always block has a context allocated at time zero. Contexts may also be allocated past time zero for fork-join blocks and nonblocking assignments. This is a blocking call that does not abort a transaction. If the transaction aborts, the context creation does not roll back and the context is leaked until the garbage collection comes to clean it up. At some time after the context is created and returned, a function/ar/state/index are assigned to the context by the user by calling a pair of instructions sch_args and sch_block.

sch_alloc_enq_proc(delta, seq_region): This instruction allocates a new context structure from the free list and enqueues it in TQ to be run after the given delay delta and in the given region. The second argument seq_region contains a bit indicating whether the context should always be run sequentially or not and the execution region. For some embodiments, region is a value between 0 and 63. This instruction call is not blocking and nothing is returned to the caller.

sch_free_proc(ctx_id): This instruction returns a context to the free list. It is called from inside compiled or runtime code when execution of the block terminates. The compiler and runtime ensure that a context ID cannot be referenced after being freed. Such references may be from other ARs, or be from the event queues. In some embodiments, this is enforced by restricting uses of sch_free_proc in all but the most trivial cases to the garbage collector, which will free a process context only when it can discover no further references to it.

sch_ctx_get(ctx_id): This instruction returns a bit-packed representation of the context information in a read register for the given context ID. The return context information may include index, state, suspended state indication, process context flags, and the abort/commit count.

sch_block(ctx_id, seq_state_idx): This instruction is used to update items in the process context, including state and index. Each time sch_block is called a process context flag is reset to indicate to the scheduler that the current execution of the context is complete. The argument seq_state_idx includes whether the context should be run sequentially, index and state of the context (to indicate whether the context exit normally, or is still running in some active queue, or waiting in a blocking statement, or suspended, or killed by user, etc.) The context itself represents state in two parts (base state, suspended) to support suspending a task and then having it resume with the same state as it was prior to the suspension. Additionally, the sch_block( ) instruction is used to update the abort/commit counter stored in the schContext. In some embodiments, the rb register's lower bits are used to pass information about state, index and the sequential bit. In some embodiments, certain bits of the rb register are used to control an abort/commit indicator in the rb register, e.g., when bits [31:30] are both 0 bits [47:32] will be ignored; when bit 31 is 1, bits [47:32] holds the desired value of the abort/commit indicator for context ctx_id set by the scheduler; when bit 30 is 1, bits [47:32] holds a signed short int indicating a delta that should be added to abort/commit indicator for context ctx_id.

sch_enq_delay(ctx_id, delta, region): This instruction enqueues a context for execution in a later region or time step. In some embodiments, the simulation accelerator or the compiler disallows scheduling a context more than once in the time queue. The delta argument represents the number of simulation ticks in the future to schedule the object. The region argument provides the scheduler region (0-63). This instruction is used to implement #delay of Verilog. If the delay value is zero then Verilog requires scheduling into the inactive/re-inactive region; this is left up to software.

sch_enq_seq(ctx_id): This instruction enqueues a context for sequential execution. Such contexts are dispatched to a worker processor once all other contexts in a region have executed. There is only one sequential execution queue, not one per region. It is only possible to schedule for sequential execution at the end of the current region. This feature is used in conjunction with transactional memory. If an AR causes a transaction abort then it is scheduled for sequential execution.

sch_svc_req(func,arg): Worker processors are able to schedule work on the service processor using this instruction. The two register arguments specify the PC (func) value and argument to run on the service processor. In some embodiments, the instruction is blocking and if it occurs in a transaction the transaction will be aborted by the scheduler. This is required because the request to the service processor cannot be rolled back and the result cannot be gotten immediately. The return value is passed back to the scheduler from the service processor by sch_svc_proc. If the function argument is 0 the scheduler will do nothing and the worker will be blocked waiting for the return. This is used by the worker when it's making a RPC call to put it into blocking mode awaiting a response from the DMAC which will use sch_svc_ret instruction to return the RPC buffer. In some embodiments, the instruction can occur in a transaction and will be added to the deferred queue.

sch_svc_ret(ret_val, hart_id): The service processor provides a result to a work processor using this instruction. The first argument is the return value, and the second is the hart ID of the worker that issued the request. Behavior is undefined if the indicated worker is not blocked on a request.

sch_run_region(func, mask): This instruction requests the dispatch of a scheduling region. Typically, this is issued by the service processor. mask is a bit mask indicating which regions can be permitted to run. The scheduler must AND the mask with the set of regions currently having available work, and then choose the lowest-numbered region remaining in the result. All items in the resulting region are staged in a holding area and will be dispatched to worker processors as they call sch_next. Once all work has been dispatched and the system is idle, the sequential queue will be dispatched. Once this work has been dispatched and the system is idle again, the func given as the argument to this instruction will be dispatched to the service processor. Typically, this function is used to determine which region to run next or may advance to the next timestep with sch_adv_time. The system is idle when the EQ (EventQ) has no pending events and the EQ is idle and there are no pending events between the EQ and TQ (TimeQ) and all workers and the service processor are all waiting in a sch_next state. The separation between EQ and TQ requires the additional EQ checks. Due to the holding area, once dispatch has started, any work scheduled into the selected region will not be dispatched until after the next call to sch_run_region( ). You can envision the sch_run_region instruction as copying the head/tail pointers of the work queue for the selected region to the holding area, then zeroing the pointers in the selected region.

sch_adv_time(func): This instruction requests an advance to the next time step. The supplied func is executed on the service processor once the advance is complete. At that time, CUR TIME and REGION AVAIL will be updated to reflect values for the next timestep.

sch_ff_test(context,mask): This instruction performs a logical AND of the current value of the flags with the provided mask and returns the result of the AND in rd. This instruction is permitted inside a memory transaction, it will be executed immediately and the caller will block until it returns.

sch_ff_set(context,mask): This instruction is used to set flags. A "1" bit in the mask will cause the corresponding flag to be set. This instruction is permitted inside a memory transaction; it will be queued until commit.

sch_ff_clear(context,mask): This instruction is used to clear flags. A "1" bit in the mask will cause the corresponding flag to be cleared (AND NOT). This instruction is permitted inside a memory transaction; it will be queued until commit.

schContext: has a 1-bit member m sequential which identifies the context as always being run sequentially when the value is 1. The initial value is set at the time of allocation using sch_alloc_enq_proc( ) based on the compiler's static determination. It can be set to 1 using the sch_block( ) instruction. It also has an integer variable m_AbortCommitCt counter. If the value of m_AbortCommitCt counter is at the max or min boundary of what can be held any request for a delta to pass that boundary will result in the counter being set to the boundary value.

In some embodiments, the scheduler 220 is a piece of designated hardware inside the accelerator 200. This allows instructions to interact with the accelerator system even when the instruction is inside a transaction, and the different threads or cores may communicate with each other through the scheduler rather than by writing and reading the same memory address. Thus, a first context running inside one transaction may communicate data to a second context inside another transaction without triggering abort through the scheduler. For example, the first context may write to a variable, issue an instruction to wake up the second context to process the variable. In some embodiments, the wakeup instruction is buffered while a transaction is outstanding, and is executed when the transaction is committed.

Figure 10:
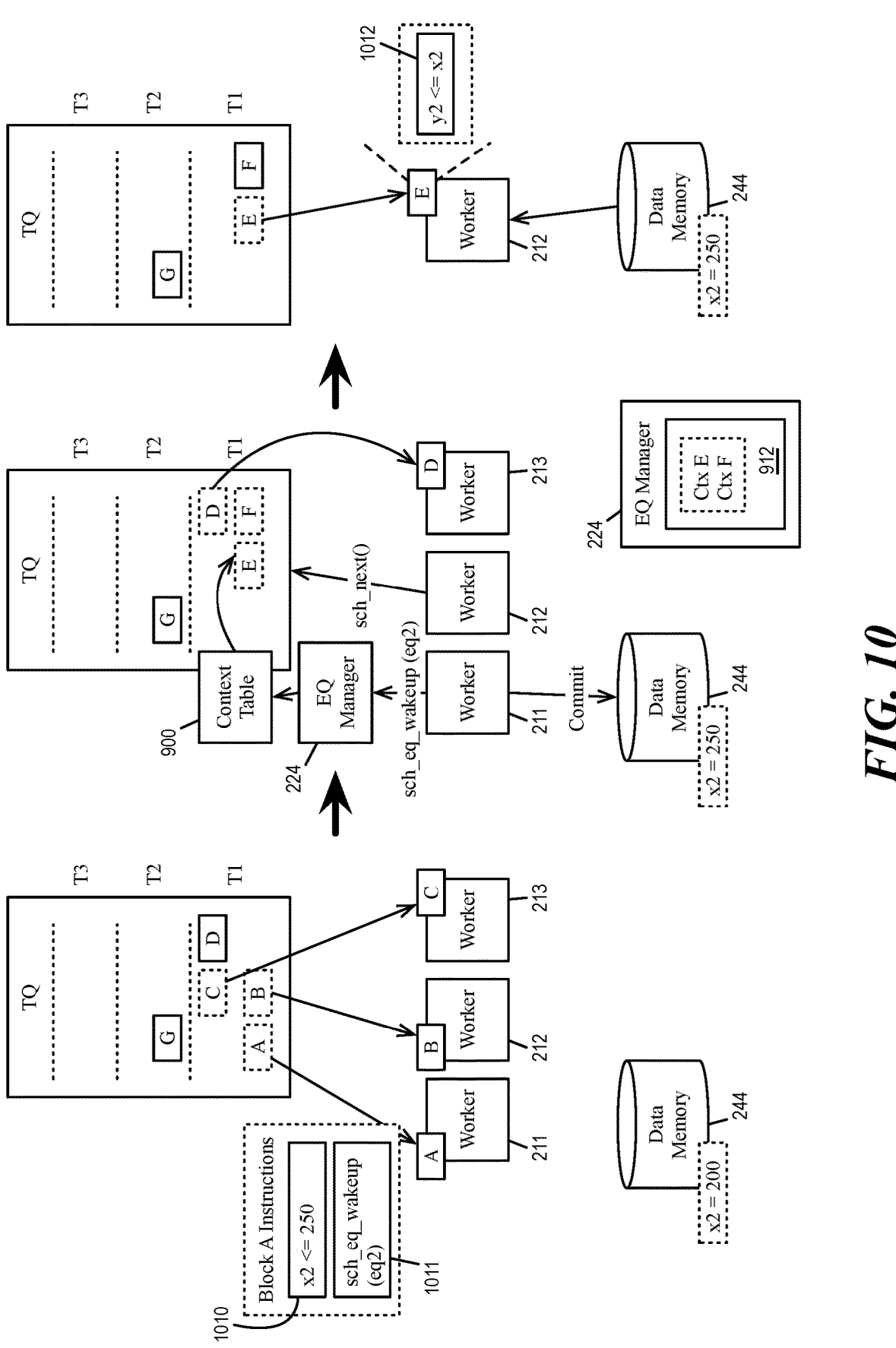
FIG. 10 conceptually illustrates inter-process communications through the scheduler that do not cause transactions to be aborted.

FIG. 10 conceptually illustrates inter-process communications through the scheduler that do not cause transactions to be aborted. The figure illustrates contexts for block instances A, B, and C running in worker processor cores 211-213, respectively. A variable "x2" has a value of 200 in the data memory 244. Block A includes an instruction 1010 that sets the variable "x2" to 250 and also an instruction 1011 that wakes up the EQ 912, which has entries for contexts of blocks E and F.

As the worker core 211 completes executing block A and commits the transaction, the variable "x2" in the data memory 244 is updated to value of 250. The wakeup instruction 1011 also executes to wake up the EQ 912, which causes contexts for blocks E and F to be placed in the TQ 222 at the current time step T1.

The worker core 212 is assigned to execute block E for the time step T1. The simulation data for block E is fetched into the cache of the worker core 212. This data includes the variable x2. Block E includes an instruction 1012 that uses the variable "x2", which is now updated to 250 by earlier execution of block A. In other words, block A in one transaction has successfully communicated data to block E in another transaction.

In some embodiment, to support executing multiple operations/actions for a block of compiled code as one transaction, (full block transactionality), certain operations (such as sch_eq_wakeup) are buffered internal to a processor while a memory transaction is in progress. These operations complete once the transaction is committed, and are discarded if the transaction aborts. The operations subject to buffering include scheduler requests and traced stores. In some embodiments, a traced store is treated just like any other store to the memory: it is held in the processor cache until the transaction is committed.

Figure 11:
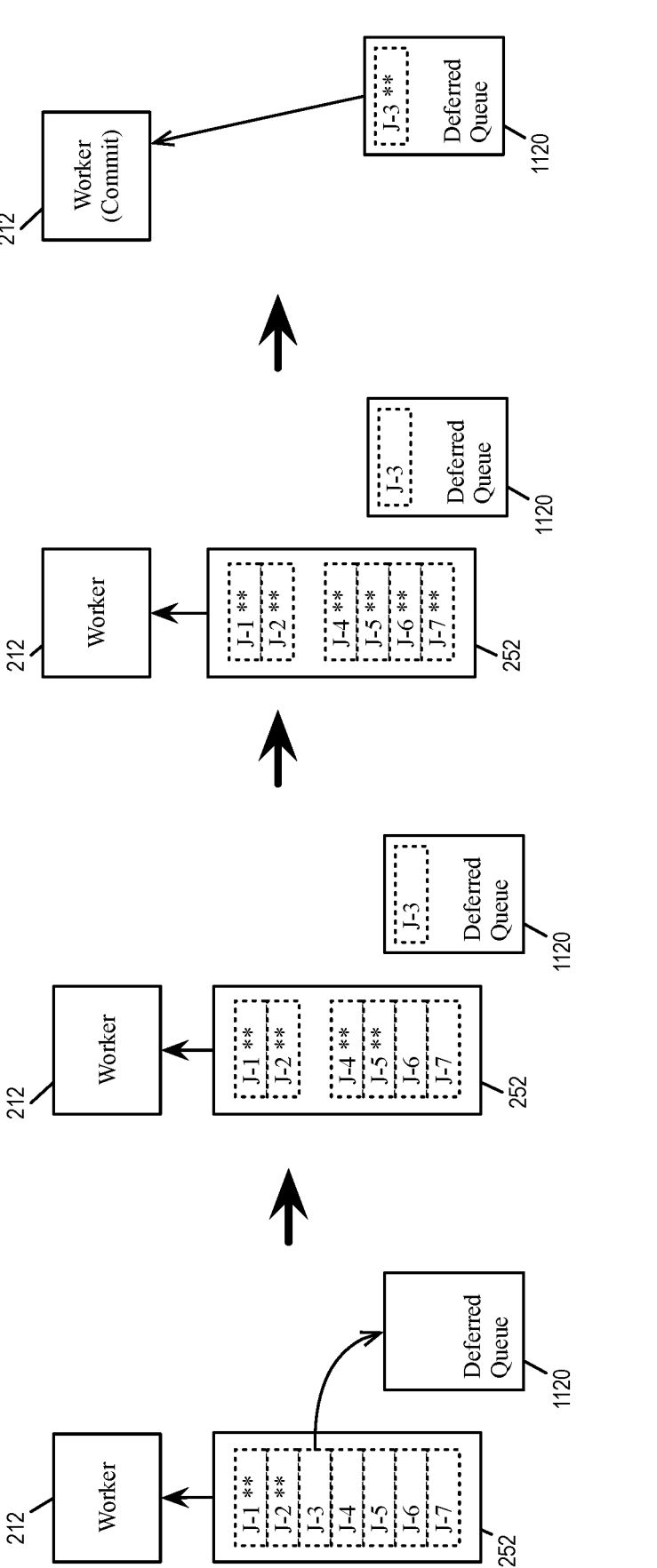
FIG. 11 conceptually illustrates an instruction in a memory transaction being deferred until the transaction is complete (i.e., commit).

FIG. 11 conceptually illustrates an instruction in a memory transaction being deferred until the transaction is complete (i.e., commit). The figure illustrates a function block J having instructions (instructions labeled J-1 through J-7) that are fetched and executed by the processor core 212 as a transaction. Among these instructions, the instruction labeled "J-3" is classified as a deferred instruction. The processor core 212 places the instruction J-3 in a deferred queue 1120 on the processor core. After all other instructions of the transaction 1110 have completed execution and the transaction has committed, the processor core 212 executes the instruction(s) in the deferred queue 1120. The deferred instruction may be an instruction that mutates a global state but does not return a result, or another type of instruction that requests a scheduler operation (e.g., sch_eq_wakeup).

Figures 12A, 12B, 12C:
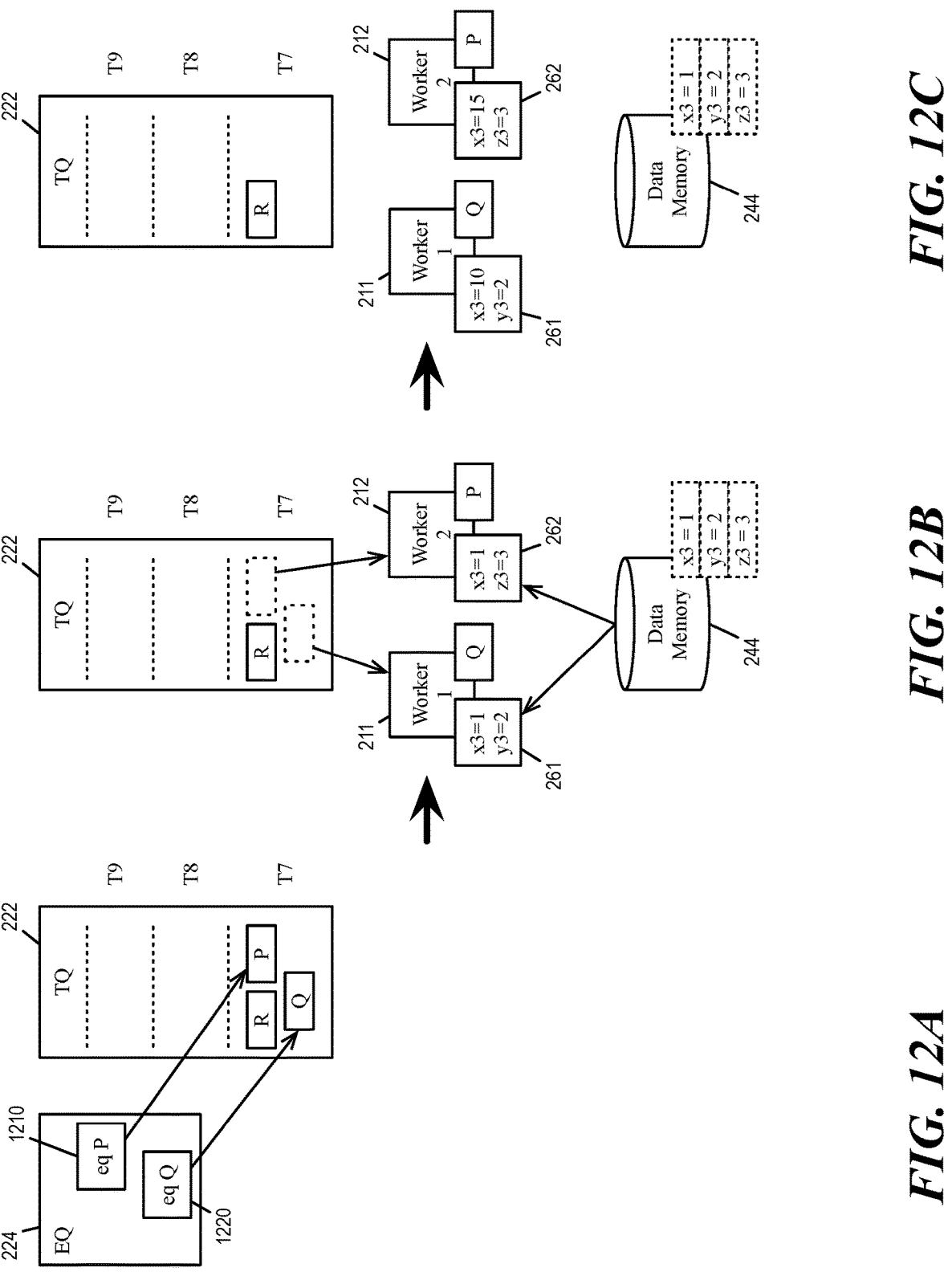
FIGS. 12A-F conceptually illustrate conflicting transactions being aborted and retried sequentially by the scheduler for the same simulation time step.

FIGS. 12A-F conceptually illustrate conflicting transactions being aborted and retried sequentially by the scheduler within the same simulation time step. FIG. 12A shows the EQ manager 244 having two EQs that have been awakened. One EQ is awakened to place a context for block P, and the other is awakened to place a context for block Q in the TQ 242 for time step T7. The function blocks P and Q are classified as transactions by the compiler. The function block P and the function block Q both access a variable X during the simulation.

FIG. 12B shows the worker core 211 assigned to execute function block Q and the worker core 212 assigned to execute function block P. The simulation data in the data memory 244 has three variables x3, y3, and z3 that have values 1, 2, and 3 respectively. These three variables are loaded into the data caches of worker cores 211 and 212.

FIG. 12C shows the function block Q at worker 211 having a conflicting write with the function block P at worker 212. Specifically, core 211 running the function block Q has changed the value of x3 to 10 in its data cache 261 and the core 212 running the function block P has changed the value of x3 to 15 in its data cache 262.

Figures 12D, 12E, 12F:
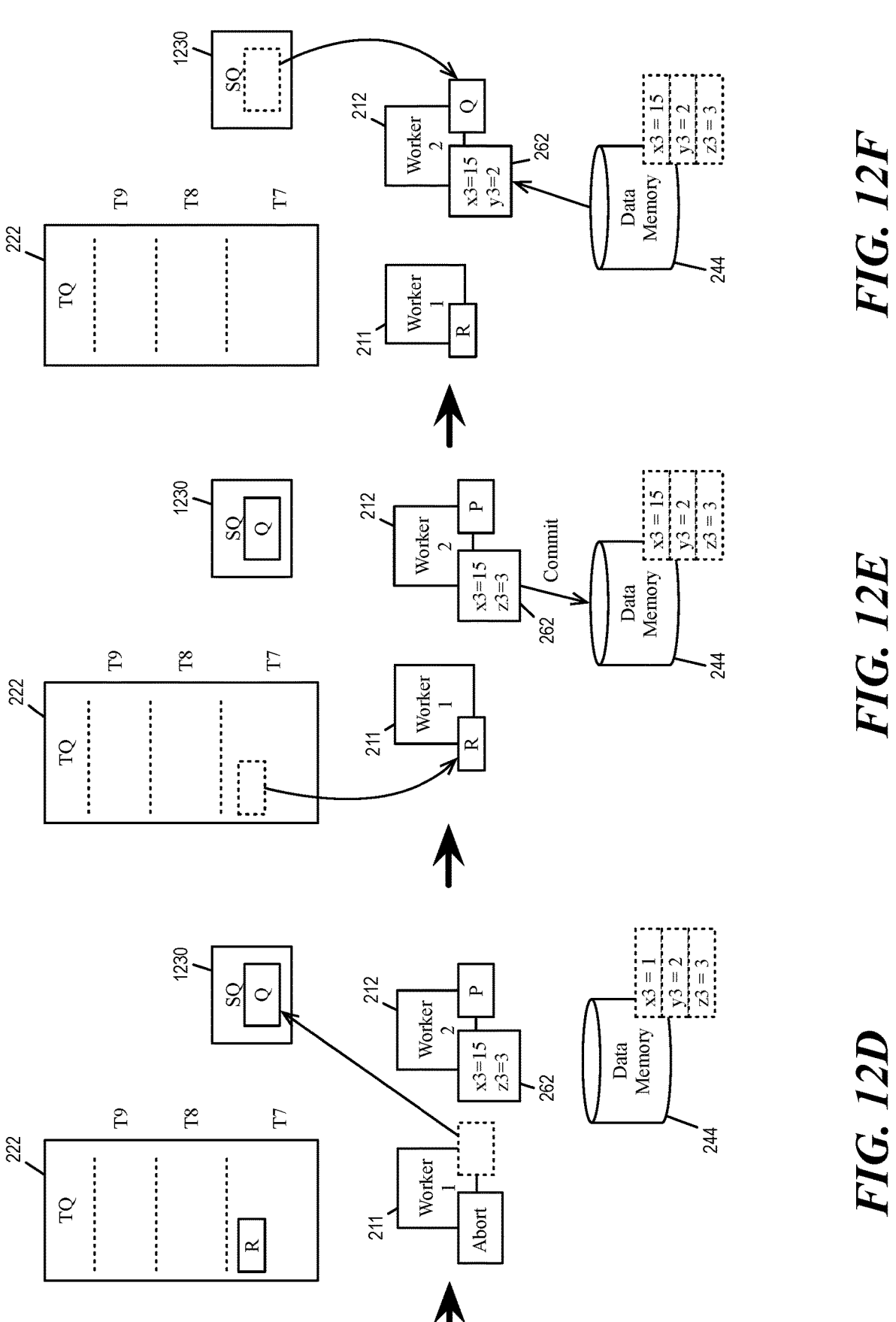

FIG. 12D shows the snoop controller 240 detecting the conflicting write operations and causing worker 211 to abort function block Q, while the function block P continues to execute at worker 212. The context of the function block is stored in sequential queue 1230 to be executed later.

FIG. 12E shows the worker core 212 completing block P and committing the transaction, as the value of x3 in the data memory 244 is updated to 15 based on the content of the data cache 262 of the worker core 212. In the meantime, the worker core 211 is assigned another function block R to execute, while the context of block Q waits in the sequential queue 1230.

FIG. 12F shows the scheduler providing block Q from the sequential queue 1230 to the processor core 212. The simulation time remains at time step T7. The variable x3 (with the updated value 15) is fetched from the data memory (244) into the data cache 262 for access by the worker core 212.

In some embodiments, the simulation accelerator provides status and control registers for the service processor and the worker processors. Some of the status registers are global to all processors or harts, such as bits indicating which of the scheduling regions has work available, in progress, or has just completed, or bits indicating the current scheduling time, or the time of the region just completed, or the time of the next timestep for which there is scheduled work. Some of the status registers are hart-specific, such as bits indicating the hart id of the current processor, bits indicating the currently running scheduler context (this is set by the scheduler when returning work to sch_next( )), bits indicating the current running process pointer, bits indicating the current running context id (this is written by the hart when the context is received from sch_next.)

The following are instructions for scheduler operations related to management of the event queue:

sch_eq_enqueue/sch_eq_enq_dynamic(eq_id, ctx_id, ra, rb): this instruction enqueue into the event queue. The arguments include the index, region, flag, as well as the hint read from CSR.

sch_eq_remove(eq, hint): this instruction removes a context enqueued with sch_eq_enq_dynamic instruction. The arguments eq and hint are the ones used when the context was enqueued with sch_eq_enq_dynamic.

sch_eq_wakeup(eq, cur_ctx_id): This function awakens all processes blocked on the event queue eq. In some embodiments, in order to protect against infinite loops caused by self-sensitizing contexts, the scheduler (EQ manager) skip entries with context ID (ctx_id) that is the same as the current context (cur_ctx_id) while looping through the entries of the event queue eq. The current context ID is read by the user code and passed in as cur_ctx_id. The cur_ctx_id is 0 during initialization when the service processor is the caller and therefore is a valid second argument to sch_eq_wakup.

sch_alloc_eq( ): This instruction allocates an event queue and returns a 32-bit handle to it. This instruction may be executed after system initialization, e.g., to initialize a variable of event data type in a class handle or to set up sensitivity to an automatic variable. This is a blocking call that does not abort a transaction. If the transaction aborts, the event queue creation is not rolled back and the event queue (e q) is leaked until the garbage collection (GC) comes to clean it up.

sch_eq_triggered(eq): If eq is 0 it returns 0. This instruction returns 1 as read data if the given event queue has been triggered in the current timestep and 0 otherwise. In some embodiments, the EQ tracks when an event queue is triggered. In some embodiments, this instruction is automatically aborted if in a transaction. This is because EQ manager's memory is not under transactional control.

In some embodiments, the scheduler 220 includes a deferred dispatch queue inside its TQ component. A dispatch of a context may have to be deferred to the end of the current simulation region. For example, an event queue Q (residing in the event queue manager EQ) containing a context D is awakened with a sch_eq_wakeup(Q) instruction received by EQ. D is transferred to the TQ in preparation for dispatch and when the TQ manager is ready to dispatch D it is determined that D is already running on a worker. In this case, the context D is put on a deferred dispatch queue inside the TQ. (This is not the same as the deferred instruction queue 1120).

To implement the deferred dispatch queue, in some embodiments, an additional bit is added to the context state (state dispatched bit, or m_dispatched flag). The state dispatched bit is initialized to 0 and reset to 0 whenever sch_block( ) instruction executes for the context including when it sets the state to TST_RUNNING. It is set to 1 when the context is given to a prefetcher fifo and to set to 0 inside instruction sch_enq_delay( ) because these are AR's that do not call sch_block and will just be sent straight to the TQ. This ensures that if the context aborts the sch_block issued by the abort handler will clear the m_dispatched bit. This is because the context memory is not part of the transaction and thus must be explicitly changed back in some embodiments.

In some embodiments, there is a list of wakeups that are to be deferred when they come in through the TQ's FIFOs. These wakeups are stored in the deferred dispatch queue until the end of the current simulation region and will be processed as the last step, even after processing the content of the sequential queue 1230, but just before requesting regionDone from the service processor. Duplicate entries (keying on context_id+eq wakeup index) are filtered either on the way in or when they are being processed to avoid waking up a context that is already dispatched. As the deferred wakeups are being processed (including index checks and state checks), the m_dispatched flag being true means the context which was already running did not end with a sch_block (which is the only way to clear the m_dispatched flag). That also implies the context is completely finished and is not expected to run again. In this case, the m_dispatch flag is set to false and the state to TST_FINISHED to skip running the context. The resulting dispatched work may invoke additional scheduler instructions (sch_*calls) and those instructions may cause a new region in the TQ 222 to be added to handle the newly scheduled work. Once the end of the deferred dispatch queue is reached the current simulation region is done, regionDone can be scheduled/executed.

In some embodiments, when a context is being considered for dispatch in the TQ 222, the handling of the context depends on the context's current state within the scheduler. For example, in some embodiments, when the context state is TST_RUNNING and the m_Dispatched flag is false and the wakeup is ignored, and when the context state TST- _RUNNING and the m_Dispatched flag is true the wakeup is placed in the deferred wakeup queue.

In some embodiments, a learning algorithm is employed for determining sequential execution. As mentioned earlier, an aborted context may be rescheduled to run sequentially once in the same simulation region. However, this context may again be attempted in parallel in future regions since the context may not abort the next time it is run in parallel. Some ARs have a high probability of aborting every time they are run in parallel mode. The learning algorithm calculates a cost for every transaction and updates a m_AbortCommitCt counter for the context in the scheduler. If the value of m_AbortCommitCt counter crosses a threshold the context is marked to be run sequentially on every future execution. In some embodiments, the software running on the processor core determines the counter delta for an abort depending on abort type, and a different delta for successful committed transactions. The software communicates the delta to the scheduler with instructions such as increment via sch_block( ) right after mt_commit, or decrement via sch_block( ) during the handling of an mt_abort( ).

As mentioned, work objects or contexts in a simulation region can be dispatched to run in parallel. In some embodiments, no execution order is enforced between these work objects in the same simulation region, but the compiler may enforce execution order by, for example allocating a special context in the active region with links to each triggered NBA, then schedules the special context, and only the special context, for execution in the NBA region. When the special context is dispatched to a worker core, the worker executes each linked context in order without returning to the scheduler.

E. Memory Allocation Gasket

The use of transactional memory allows parallelism only in cases where threads do not mutate global state. However, threads may mutate global state if they allocate memory from a heap manager having a global state. This operation is expected to be common, as allocation is required for many operations such as invoking tasks or scheduling non-blocking assignments. The memory gasket (MG) 270 is a memory allocation manager or engine that allows worker processors to request and obtain memory allocation while inside a hardware memory transaction without accessing global state that would cause a transaction rollback. This allows an instruction inside a transaction to request memory from the MG 270, and that may cause the MG to ask the service processor 210 for more memory. Such instructions may cascade and can do so without jeopardizing the transactions because in the normal flow of events, the MG returns a piece of memory from the global heap (a global variable) despite being inside a transaction.

The hardware memory allocation engine can be thought of as an array of FIFOs (also referred to as queues). A separate FIFO is used for each block size (rounded up to some granularity). Each FIFO contains addresses of free blocks of the given size awaiting allocation. An allocation operation pops the next address off the FIFO. If the FIFO of a particular size is empty, the hardware allocator may take remedial action, such as to replenish the empty FIFO with free memory blocks of the size and/or to trigger a garbage collection operation to identify and reclaim allocated memory blocks that are unused.

Figure 13:
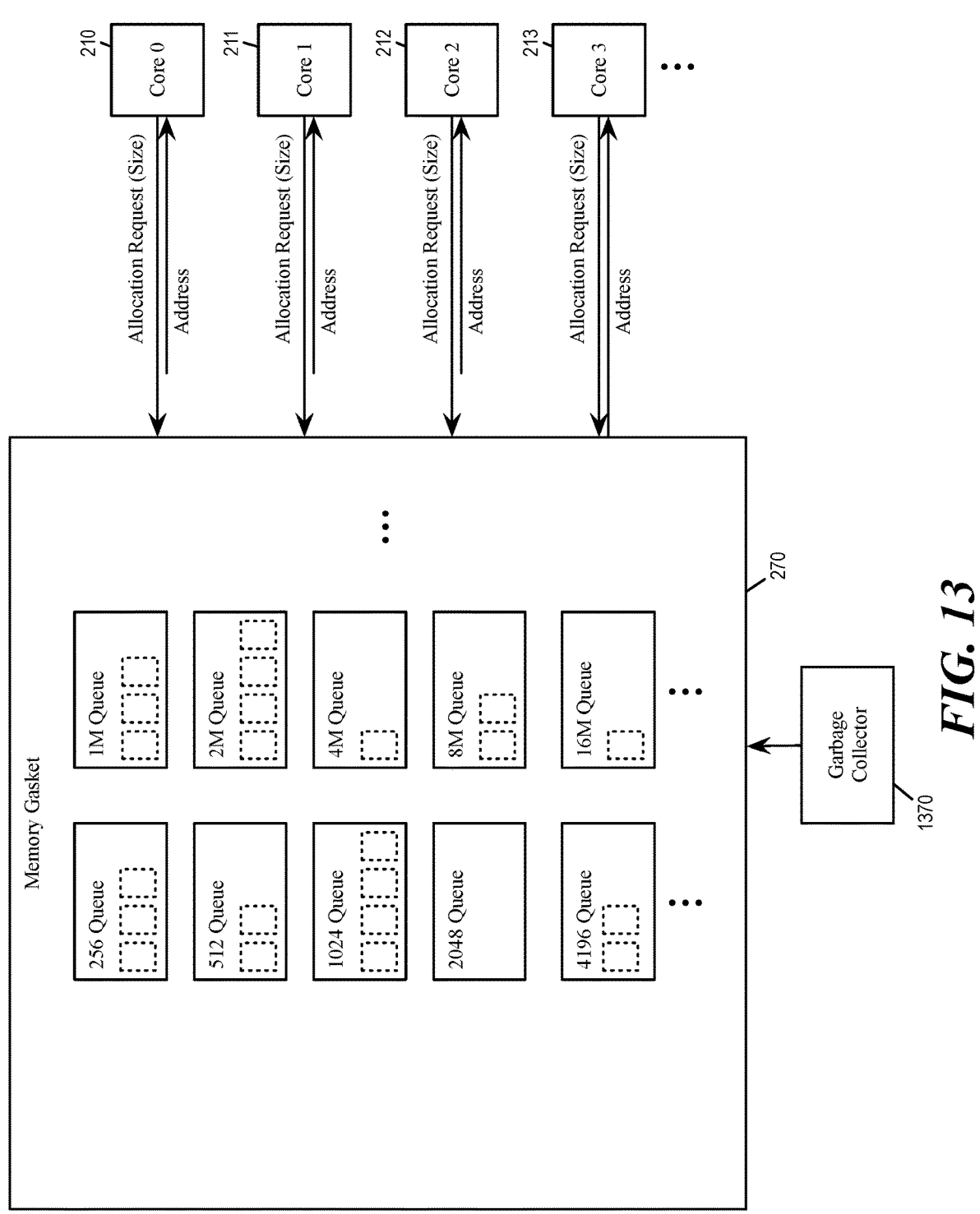
FIG. 13 conceptually illustrates a memory gasket for memory allocation.

FIG. 13 conceptually illustrates a memory gasket for memory allocation. As illustrated, the memory gasket 270 includes FIFOs or queues for different sizes of memory allocations. Each FIFO of a particular size queues up pointers or addresses that correspond to free memory blocks of that size in the data memory 242 (physically in the heap memory 290). Each FIFO corresponds to a different power of two size. The memory gasket replenishes each FIFO by identifying memory locations that are currently free. A garbage collector mechanism 1370 searches for allocated memories that have been leaked or no longer in use (e.g., due to aborted memory transactions), mark them as unallocated, and make them available for replenishing the different FIFOs in the memory gasket 270. In some embodiments, the memory gasket 270 requests replenishment from the service processor 210.

The memory gasket 270 allows multiple cores or threads to request and obtain memory allocation at the same time without contention. Each processor core 210-219 has an interface with the memory gasket to request a memory allocation of a specific size based on memory allocation instructions listed below. Such a request for memory allocation is not considered as part of a transaction, so no abort will occur because of memory allocation. Memory blocks are pre allocated prior to request so incur minimal latency.

The simulation accelerator supports various memory allocation related instructions. These instructions operate both inside and outside a memory transaction. If a transaction is aborted, any memory allocated by the transaction is temporarily leaked, but will be reclaimed at the next garbage collection. Instructions related to memory allocation (memory gasket) operations include:

gc_malloc(sz) is an instruction that allocates memory of the given size, including those that are garbage-collected. The memory may contain pointers to other garbage-collected objects. The memory is guaranteed to be zeroed prior to being returned to the user. The clearing operation may occur as part of garbage collection or upon executing instruction gc_free( ). In some embodiments, the accelerator also supports a special case instruction svc_proc gc_malloc (sz), which is allowed to return NULL and the memory gasket will not initiate a replenish on an out of memory condition to avoid a deadlock situation. Instead, the service processor will check for a NULL return and immediately do a replenish for the memory gasket and then request memory from the MG again.

gc_malloc_atomic(sz) is an instruction that does the same, except that this instruction is used to indicate that the memory does not contain pointers to other blocks (including scheduler contexts and event queues). The memory will not be scanned to find references to such objects. Furthermore, the memory may contain arbitrary data when returned to the user. In some embodiments, the accelerator also supports a special case instructions svc_proc gc_malloc_atomic(sz), which is allowed to return NULL and MG will not initiate a replenish on an out of memory condition, the service processor handles the NULL condition in the same way as for gc_malloc(sz).

gc_free(ptr, sz) is used to explicitly free allocated memory. A pointer to the block is given in ra, and its size in rb. Internally, the block is enqueued to a queue of blocks that must be cleared, after which the block may be put back in its proper allocation queue. In some embodiments, this instruction is not allowed to be executed inside a memory transaction. If this instruction is called within a transaction, it will be added to the deferred instruction FIFO on the processor, to be processed only after the transaction commits. This instruction is provided as an alternative for those system functions that pool memory to reduce pressure on the garbage collector. The instruction is invoked with the size of the memory object as well as its location. Along with the size are two flags that are stored in the least significant bits of the address. A first flag (GCF_ATOMIC) indicates that the memory block was allocated from atomic memory and ought to be returned there. A second flag (GCF_NOCLEAR) indicates that the memory block is to be returned to non-atomic memory, but it's not necessary to clear/zero the block (for e.g., when a memory block is allocated for the very first time when it's already set to zero).

In some embodiments, these memory allocation instructions can be used inside a memory transaction. If the transaction is rolled back (aborted) then the allocated memory will be leaked, but ought to be reclaimed (returned to the heap) on the next garbage collection.

In some embodiments, memory being returned to the non-atomic heap will be cleared to zero by the gasket. The memory writes are coherent. In some embodiments, to prevent this zeroing out from causing a rollback or transaction abort, the instruction gc_free can be added to the worker's deferred queue and executed after transaction commit.

In some embodiments, the memory gasket maintains a separate free list of atomic and non-atomic memory for different sizes in power of 2, from 16 bytes to 2 GB. For each size, the memory gasket maintains the following queues: (i) a non-atomic supply queue for satisfying allocations of non-atomic memory blocks; (ii) an atomic supply queue for satisfying allocations of atomic memory blocks; and (iii) a non-atomic freed queue for holding freed objects that require clearing to zero prior to being recycled into the non-atomic supply queue. In some embodiments, the atomic and non-atomic supply queues have configurable low and high watermarks. The non-atomic freed queue has a configurable high watermark.

If, prior to an allocation request, the number of blocks in the supply queue is equal to or less than the low watermark, and (for non-atomic memory) there are no blocks in the corresponding freed queue, then a request is sent to the service processor for replenishment via an instruction sch_svc_req(replenish_mem_gasket, sz). A replenish active flag is used to indicate when a replenishment is active. Replenishment allocations are forced to be aligned to 64 byte boundaries so that when the allocated memory is used for an AR it is cacheline aligned thus avoiding aborts caused by 2 AR's sharing a cache line. If, prior to a gc_free request, the number of blocks in the supply queue is equal to or greater than the high watermark, then the freed memory will not be pushed onto the queue. The freed memory will be lost and reclaimed on the next collection. In some embodiments, the low watermark can be configured to zero. This means that by default no free blocks exist in the queue, and a service request will be sent each time a worker attempts to allocate a block. This feature can be used for very large blocks (>=1 MB), where it would be inefficient to pre-allocate memory. In some embodiments, a worker processor may return memory using gc_free instruction if it knows that the memory will not be required further. If the size of the corresponding freed queue is greater than the high watermark, then the returned memory will be lost.

In some embodiments, while there is room in the non-atomic supply queue (as defined by the high watermark) and items exist in the corresponding freed queue, the gasket will remove an item from the freed queue, zero out the memory, and then push the item onto the supply queue. If multiple freed queues have items, the queue for the smallest size blocks is served first. In some embodiments, atomic memory freed by the gc_free instruction, or on-atomic memory that is cleared by the service processor, does not go to a freed queue. It goes directly onto the supply queue.

In some embodiments, the operation of the memory gasket is controlled by a set of configuration registers, which may be implemented as a register file. These configuration registers may correspond to the following: non-atomic supply queue low watermark, high watermark, and current level; atomic supply queue low watermark, high water mark, and current level; freed queue high watermark, low watermark, and queue level. In some embodiments, the MSB in each of these registers is a replenish active flag. The configuration registers may also include an address of a handler function replenish junction that is used in service requests to replenish memory. It takes one argument which is the size of the block requested as a power of 2 and the LSB, if set, indicates atomic. When complete, the replenish function clears the MSB in the appropriate configuration registers (e.g., registers for supply queue low watermarks) to indicate to the memory gasket that it's done. The configuration register may also include miscellaneous control bits enabling a direct memory access (DMA) engines or the memory gasket. The configuration registers may also include bits that are status bits for indicating the DMA or the memory gasket is currently busy.

In some embodiments, the memory gasket is initialized according to the following procedure: (1) disable all functions of the gasket; (2) configure high watermarks to limit resource usage by the gasket; (3) configure low watermarks to set up some non-zero reserve that workers can draw upon, or 0 for larger block sizes; (4) set or ensure the replenish_active flag; (5) set up the address of the replenishment_junction; (6) enable the gasket; (7) pre-load some memory using gc_free instructions.

When the memory gasket requires attention, it sets a replenish_active bit for the block size of interest and injects a service request into the scheduler, which causes the replenishment function to be queued for execution on the service processor. In some embodiments, when another request for memory of the same block size comes in and if the replenish_active flag is set, the requester may not make another replenish call (unless the low watermark for that block size is 0). In that case, another call to replenish can be made even if the flag is set because the active replenishment operation will only produce a single block.

The replenishment function (replenishment_junction) takes one argument, which is the size of the block requested. The size is given as a power of two. The least significant bit of the size, if set, indicates that the request is for atomic memory. In response, the service processor may execute one or more gc_free instructions to replenish the requested queue. The service processor is able to read the current fill level for the queue and compare it to the high watermark to avoid over-filling the queue.

In some embodiments, the simulation accelerator supports instructions that resolve possible deadlocks at the memory gasket for memory allocation operations. For example, since gc_malloc is a blocking instruction, if it is called from the svc_proc (service processor) and the memory gasket needs a replenish to service that, this would be another call to svc_proc and result in a possible deadlock situation. As a solution to this, in some embodiments, svc_proc may receive null response from the memory gasket when invoking gc_malloc. If the svc_proc receives the null in response to gc_malloc it will immediately perform a replenish_mem_gasket operation then make another gc_malloc call.

In some embodiments, the gc_malloc instruction does not abort a transaction when a replenish is not required, even though gc_malloc is a blocking instruction (i.e., it must be performed before the next instruction can be executed.). In a transaction in which a gc_malloc operation is aborted, the memory that was allocated is leaked and cleaned up by the garbage collector. The gc_free instruction can be issued during a transaction and will be added to the deferred queue, which executes the gc_free after the transaction but only if the transaction was successful. In some embodiments, if the memory gasket runs out or is low of a particular memory size and multiple gc_malloc come in for that size, only one replenish call is made.

F. Remote Procedure Call

In some embodiments, the simulation accelerator implements a Remote Procedure Call (RPC) mechanism that permits software running on a board that implements the accelerator to call functions on the host, and vice-versa. In some embodiments, the RPC mechanism is used to execute system calls on the host and to allow VPI calls from the host into the board. The RPC mechanism allows PLI/DPI code residing on the host to call into the accelerator for PLI callbacks or DPI export.

In some embodiments, both sides of the communication (the host and the board) (1) initialize the RPC layer and establish the connection between the host and the board on the given port; (2) control memory allocation operations such as garbage-collection, hardware memory gasket, pooling, freeing memory, etc.; (3) perform an RPC call and wait for a reply. Traffic between the host and the accelerator is encapsulated in RPC buffer instances. These buffers implement a linked list of buffer segments into which data is written. Segments are used to eliminate the need to reallocate memory and copy data in the event a call transports a large array.

In some embodiments, the RPC mechanism is facilitated by hardware operations. For example, RPC is used to transport a buffer/segment to a peer using DMA over PCIe. Upon receipt of a buffer/segment from the peer, RPC is used to alert a user space function to dequeue and process. In some embodiments, this may be implemented as an interrupt on the host, or as a user space code as e.g., a service request. In some embodiments, any call from the host onto the accelerator will be made while servicing an RPC call originating from a thread (or hart) running in the accelerator.

G. Trace Buffer

In some embodiments, the compiler identifies memory ranges for different variables/ports in the source design, and the system captures data from those memory ranges for wave dump. In some embodiments, coherent stores and write-through stores may optionally be traced. In some embodiments, for coherent stores/write throughs, the trace operations are buffered pending commit of the transaction. If waveform dump is not enabled, then trace buffer transactions are not sent to the trace buffer. A traced store causes an (address, data) tuple to be issued to the trace buffer controller. In some embodiments, if a memory transaction is in progress, the trace operations are buffered pending commit of the transaction. Specifically, a traced store is held in the hart cache pending commit, just like any other store. More generally, when any store issued to main or heap memory hits an address range identified as being enabled for tracing then the trace buffer would see it, regardless of whether the store was part of a memory transaction. On the other hand, if waveform dump is not enabled, then trace buffer transactions are not sent to the trace buffer. In particular, trace buffer transactions are not buffered pending commit of a memory transaction, and therefore cannot cause an abort.

H. 4-State ALU

In some embodiments, the simulation accelerator employs 4-state ALUs. A 4-State ALU allows 4 different possible values or "quat" for each bit, namely '1' (logic high/true/one), '0' (logic low/false/zero), 'Z' (floating or tristated), and 'X' (unknown). The 4-state ALU represents each bit using a C bit and a D bit according to the following table:

| C | D | quat |
|---|---|------|
| 0 | 0 | 0 |
| 0 | 1 | 1 |
| 1 | 0 | Z |
| 1 | 1 | X |

In some embodiments, 4-state data is stored in regular 64-bit integer registers. Each 64-bit word contains 32 C bits in bits [63:32], and 32 D bits in bits [31:0]. Since RISC-V is little-endian, a properly aligned logic32_t (32-bit logic value) can be loaded in one instruction. For this reason, the accelerator will use 32-bit limbs even though it is a 64-bit system. In some embodiments, alternate formats are used for storing smaller variables. For variables >32 bits, the limb arrays is 64-bit aligned. This allows use of direct 64-bit loads/stores on the little-endian array data. More generally, while in a register, all variables are stored as 32-bit values.

The following are example instructions of the simulation accelerator that are processed by the 4-state ALU.

Arithmetic Instructions:

add_4s and sub_4s are instructions that perform addition and subtraction, respectively. The result is 32'bx if any input operand bit is X. These instructions also update the state of a dedicated carry flag, which may be 0, 1 or X.

addc_4s and subc_4s are instructions that perform multi-precision addition and subtraction, respectively. They behave like add_4s and sub_4s except they also take the carry flag into account.

mul_4s is an instructions that performs a multiplication (32×32->32). Signed/unsigned does not matter.

divu_4s and divs_4s are instructions that perform unsigned and signed division, respectively. (32/32->32). Division by zero results in 32'bx.

modu_4s and mods_4s are instructions that perform unsigned and signed modulus, respectively. Modulus by zero results in 32'bx.

Logic Instructions:

lut2_4s is an instruction that evaluates a generic 2-input lookup table as a function on the inputs. The LUT is expressed as a constant in the instruction. Bit N of a LUT value gives the output for the input combination {A, B}. Example LUT values include:

| Value | Function |
|-------|----------|
| 0001 | A nor B |
| 0010 | A and not B |
| 0101 | not A (B operand ignored) |
| 0110 | A xor B |
| 0111 | A nand B |
| 1000 | A and B |
| 1001 | A xnor B |
| 1010 | buf A (convert Z to X) |
| 1011 | A or not B |
| 1110 | A or B |

In some embodiments, this instruction always propagates X values from input to output. In some embodiments, this is done according to the following: For each input bit (0-31):

Amask=0101 if A[i] is 0, 1010 if A[i] is 1 and 1111 if A[i] is X/Z.

Bmask=0011 if B[i] is 0, 1100 if B[i] is 1 and 1111 if B[i] is X/Z.

mask=Amask & Bmask.

sel=mask & lut

If sel==0 then result bit is 0. If sel==mask then result bit is 1. Otherwise, result bit is X.

wire_4s/wand_4s/wor_4s perform wire resolution. These instructions may produce Z as output. The instruction works over all 32 bits.

tern_4s is a ternary fold operation. This operation is required for the ternary operator in the event that the selector expression is X.

mvu_2s_4s and mvs_2s_4s convert values from 4-state to 2-state. A metavalue in the input will result in a 0 in the output. These instructions zero-extend and sign-extend to W bits respectively, where W−1 is encoded in the instruction. Note that the final 2-state value is extended out to the full 64 bits of the destination register.

mvu_4s_2s and mvs_4s_2s convert values from 2-state to 4-state. These instructions zero-extend and sign-extend to W bits respectively, where W−1 is encoded in the instruction. Effectively, bits [W:0] of the input are extended into bits [31:0] of the result and bits [63:32] are set to zero.

and_reduce_4s/or_reduce_4s/xor_reduce_4s/ nand_reduce_4s/nor_reduce_4s/xnor_reduce_4s perform reduction of the input operand to a single-bit result. For W-bit operand, the value W−1 is specified in the instruction. The return value is in the standard 64-bit form.

Shift Instructions:

shl_4s/shr_4s perform logical shifts. The shift count may be specified as an immediate value, or as a register. The register value is interpreted as a 4-state value; if the shift count contains a metavalue then the final result is 32'bx. Bits shifted into the result are zero. There is no limit on a register shift count; shifting by more than 32 bits will return zero.

ashr_4s is similar, but it performs an arithmetic shift: bit 31 of the input argument is replicated into the vacated bit positions of the result.

flip_4s first performs a bit flip: bit 0 is moved to position 31 and vice-versa and all bits do the same flip. Then the result is shifted right by the shift count given in the instruction. Vacated bit positions are filled with zero.

shlm_4s is a helper instruction used to insert packed data into a larger word. It behaves like shl 4s, except that a mask value is also calculated. The mask value consists of W 1-bits (W−1 given in the instruction) shifted left by the shift count. The mask is stored in a dedicated register which is accessed using the insm_4s instruction described below.

Compare Instructions:

cmp_eq_4s/cmp_ne_4s performs 4-state equality comparison. Result for cmp_eq_4s is 0 if operands cannot possibly be equal, 1 if operands are equal and have no metavalues, and X otherwise. Result for cmp_ne_4s is the logical inverse of that for cmp_eq_4s.

cmpc_eq_4s/cmpc_ne_4s perform the case comparisons, or the ===operator. Result for cmpc_eq_4s is 1 if operands are bit-for-bit identical and 0 otherwise. Result can never be X.

cmpcx_eq_4s/cmpcx_ne_4s perform the casex comparison: Z/X in either operand are treated as don't care.

cmpcz_eq_4s/cmpcz_ne_4s perform the casez comparison. Z in either operand is treated as don't care.

cmpw_eq_4s/cmpw_ne_4s perform the wildcard comparison: Z/X in rb is treated as don't care.

cmp_gt_4s/cmp_le_4s perform unsigned relational comparison. X/Z in either operand produces X as a result.

cmps_gt_4s/cmps_le_4s perform signed relational comparison.

In some embodiments, each of the above instructions has an "i" variant. These variants produce a 2-state result (either '1' or '0', no 'X' nor 'Z'), with X is mapped to 0. This is convenient as an input to a branch instruction.

Load and Store Instructions:

In some embodiments, the load/store instructions add a 20-bit constant to the program counter or a register. The load/store instructions add a 12-bit constant to the base register. Together, these instructions allow generation of any address within 32-bit constant displacement of some register. In some embodiments, the 4-state ALU supports the following load/store instructions:

7-bit major opcode 5 bits for register loaded/stored 5 bits for base register 12 bits for an offset to be added to base register.

3-bit minor opcode which gives gross data size to load/ store.

In some embodiments, the 4-state ALU uses 32-bit instructions and there are no 4-state sized/aware load/store instructions. In some embodiments, the 4-state ALU is configured to execute instructions that post-process data after a load, and pre-process data prior to a store. In some embodiments, 4-state loads are handled with a load operation followed by an extraction operation, and 4-state stores are handled with an insert operation prior to the store operation.

Extract Instructions:

extu_4s is the basic extract operation. It shifts its operand right by a specific number of bits, then zero-extends the W-bit result (W−1 encoded in the instruction). This is useful for performing a packed index/slice read. exts_4s is similar, but it does a sign-extension. Example: extu_4s input: 0xF000000F, w=1, i=0=>expected output: 0x100000001. In some embodiments, this instruction may perform a "zadjust/sadjust" operations that is required after arithmetic instructions. A right-shift (shr_4s/ashr_4s) instruction followed by an adjust instruction can be used for a non-constant packed slice.

Other extract operations are used to recover properly arranged 4-state data from a load instruction:

extwu_4s is used to recover data 9-16 bits wide. Such data is stored in memory as a 32-bit word. Assuming such a word has been loaded into ra, we shift right i[3:0] bits, then zero-extend the W-bit result.

To save on load instructions, it is possible to load two 16-bit items in a single 64-bit load. The extwu_4s instruction can extract data from either half of such a packed load: bit i[4] indicates which half of the input word to use.

extws_4s does the same, but performs sign-extension.

exthu_4s/exths_4s works for data 5-8 bits wide. Four such items can be packed into a 64-bit word. Bits i[4:3] select a quad of the source data, which is then shifted right i[2:0] bits, and zero/sign extended as before.

extbu_4s/extbs_4s words for data 1-4 bits wide. Eight such items can be packed into a 64-bit word. Bits i[4:2] select a subset of the source data, which is then shifted right i[1:0] bits and zero/sign extended as before.

In some embodiments, the compiler for the simulation accelerator arranges data appropriately such that a 64-bit loaded data word may contain any mix of variables that are properly aligned within the word.

Insert Instructions:

Insert is an operation that requires "folding" source bits into a target word. The target is both a source and destination in the instruction. Insert instructions have two use cases: (i) (possibly non-constant) packed slice assignment and (ii) preparing 4-state data for store to memory. In some embodiments, properly extended 17-32 bit data can be stored to memory as-is. In some embodiments, the two use cases can be combined: after copying ra to rd.

insw_4s is an instruction that prepares 9-16 bit data for store to memory: ra is copied to rd, and then bits {rb[47:32], rb[15:0]} are copied to rd[31:0] or rd[63: 32] depending on the i bit in the instruction. This prepares data for a 32-bit store, or a 64-bit store comprising more than one logical item.

insh_4s is an instruction that prepares 5-8 bit data for store to memory: ra is copied to rd, and then bits {rb[39:32], rb[7:0]} are copied to rd[i*16+:16]. This prepares data for a 16-bit store, or a 64-bit store comprising more than one logical item.

insb_4s is an instruction that prepares 1-4 bit data for store to memory: ra is copied to rd, and then bits {rb[35:32], rb[3:0]} are copied to rd[i*8+:8]. This prepares data for an 8 store, or a 64-bit store comprising more than one logical item.

insm_4s is an instruction that prepares for a masked 17-32 bit store. Recall that the shlm_4s instruction shifts data left and also computes an implicit mask value. The insm_4s instruction performs: rd=ra & ~{2{mask[31: 0]}}|rb & {2{mask[31:0]}}. This instruction performs a general (possibly non-constant) packed assignment.

inswm_4s is an instruction that prepares for a masked 9-16 bit store: rd[i*32+:32]=ra[i*32+:32] & ~{2{mask [15:0]}}|rb & {2{mask[15:0]}}.

inshm_4s is an instruction that prepares for a masked 5-8 bit store: rd[i*16+:16]=ra[i*16+:16] & ~{2 {mask[7: 0]}}|rb & {2{mask[7:0]}}.

insbm_4s is an instruction that prepares for a masked 1-4 bit store: rd[i*8+:8]=ra[i*8+:8] & ~{2{mask[3:0]}}|rb & {2{mask[3:0]}}.

In some embodiments, 2-state data (data with only '1' and '0') can be processed by 4-state instructions. For example, 2-state data can be loaded into an integer register using an unsigned load instruction. Such data may have bits [63:32]==0, and if so, can be treated as if it were 4-state data. If it is known that bits [63:32] of an integer register are zero due to evaluation of a 2-state expression that cannot generate meta values, then this register can be stored directly to memory. In some embodiments, division/modulus may return a 4-state result if the divisor is zero. In some embodiments, extu_4s/exts_4s instructions can be used to extract data from a 2-state value, producing a 2-state result. However, unpacking from a 64-bit word containing multiple values does not work, as the insert instructions may pick out C bits. However, using the 4-state ALU for 2-state data is advantageous for the following operations:

add/subtract with carry
reduction operators
LUT instruction for anything other than and/or/xor
flip Regardless, using the 4-state ALU for 2-state data is limited to 32-bit limbs. Using regular 64-bit RISC-V instructions for data 33-64 bits wide may be more efficient for other operations.

Instruction Extension

In some embodiments, the 4-state ALU supports variable-size instructions. In some embodiments, the least significant byte is used to determine the length of the instruction. For example, in some embodiments, a 16-bit instruction having bits [1:0]==2'b11, a 64-bit instructions having bits [6:0]==7'b0111111, or a 48-bit instructions having bits [5:0]==6'b011111 are used to indicate that the instruction has extension or the instruction is a variable-size instruction. In some embodiments, a 32-bit instruction having bits [1:0]==2'b11 is used to indicate a variable instruction as long as it does not map to a 48/64-bit instruction.

Strength Representation Instructions

In some embodiments, the 4-state ALU can operate on instructions that operate on logic strength data such as Verilog strength modeling representation, which represents a continuum of strengths. Each strength representation bit is represented as a byte having two signed nibbles. Negative values for the nibbles represent 0-ish values on the continuum; positive values represent 1-ish values. The following are instructions that operate on strength representations:

wire_str/wand_str/wor_str is an instruction that provides wire/wand/wor resolution of strength data. Input and output operands are integer registers, of which only the least significant byte is used.

nr_red_s_tr is a non-strength-reducing operation. This operation is required to evaluate tran connections. A supply 0/1 strength in the source is reduced to a strong 0/1 in the result. All other strengths are passed unchanged. Operand and result are integer registers, of which only the least significant byte is used.

r_red_str is the strength reducing operation, used for rtran/rnmos/rpmos/rcmos. All non-capacitive strengths are reduced to the next weaker non-capacitive strength.

Memory Allocation Interface:

In some embodiments, the processors support instructions that control memory allocation. These instructions permit transactional threads to allocate memory on the memory heap without aborting due to contention for heap shared data structures. Memory allocation operations of the simulation accelerator will be further described below. Some example instructions related to memory allocation:

gc_malloc: is an instruction by which allocated memory is zeroed and pointers to other memory are allowed.

gc_malloc_atomic: is an instruction by which allocated memory except that of the returned memory is not zero'd out and not be used to store pointers.

gc_free: is an instruction that is used to explicitly free memory.

Memory Transaction Interface

In some embodiments, the simulation accelerator implements memory transactions to support all-or-nothing semantics to be applied to an instruction sequence, thereby allowing for dynamic parallelism, i.e., parallelism between blocks whose non-interference cannot be statically proven. In some embodiments, cache-coherent memory accesses are used to determine whether any read-write or write-write inconsistencies exist at a cache line granularity. Conflicting transactions are aborted, which prevents any effects from being seen globally. The simulation accelerator may retry the aborted transactions, e.g., sequentially. In some embodiments, certain other operations, such as scheduler requests, are deferred while a transaction is in progress and are submitted when a transaction is committed.

mt_begin is an instruction used to start a transaction. This instruction takes two arguments: (1) a pointer to a function where control will be transferred in the event a transaction aborts and (2) an argument to be passed to that function when it's called, generally the AR which was being run in the transaction.

mt_commit is an instruction used to commit a transaction. Any memory operations issued prior to mt_commit form part of the transaction; any memory operations issued after do not. It's possible a single mt_begin will be followed by 2 or more mt_commits, the first should action the commit and second should do nothing.

mt_abort is an instruction used to force a transaction abort. Control is transferred to the fallback address specified in the mt_begin instruction. A transaction may also abort if a conflict is detected, if the capacity of the L1 data cache to buffer memory operations is exceeded, or if some other internal queue overflows. If mt_abort is called and no transaction is in progress nothing happens.

Scheduler Interface:

In some embodiments, the simulation accelerator supports instructions that interact with the hardware scheduler unit, including instructions for both Time Queue management and Event Queue management.

sch_args is an instruction used to pass supplementary arguments to a scheduler request. Requests require 1-4 arguments, but the instruction word can accommodate only two arguments. For requests that require 3-4 arguments, the caller must first use sch_args to pass arguments 3 and 4, and then submit the request along with arguments 1-2.

In some embodiments, there are 4 types of scheduler instructions and the high level bit encoding (bits 31:30) indicates this type allowing the scheduler to quickly determine how to manage the instruction. These types of instructions have different behaviors with regarding to transactions and with regard to deferring operations, specified by two bits 'a' and 'b', in positions 31 and 30 respectively:

00: No result, add to deferredQ if in a transaction

11: sch_next—special returns result, abort transaction, changes PC (program counter)

10: Returns result, abort if in a transaction

01: Returns result, and blocks the processor until value returned, it is ok in transactions The scheduler can make some quick decisions based on bits a&b:

if (a or b): return result if (a==1): abort

Additionally, bit 29 identifies instructions target to the TQ (time queue) vs EQ (event queue). If bit 29==0 the instruction goes to the TQ and if bit 29==1 the instruction goes to EQ.

J. Boot Sequence

In some embodiments, the host machine 205 of the simulation acceleration system follows a specific boot sequence to bring up the accelerator hardware 200. At power-up, all processors are disabled. In this state, the accelerator acts as a PCIe slave having a large memory space. The host machine 205 (x86) initializes the DDR controllers as the first step in the boot sequence (DDR DRAM controllers typically require calibration and training sequences prior to use; since the instruction memory on the accelerator is backed by DRAM, code to perform this task cannot be run on the accelerator, as no configured memory exists at boot.). The host is then able to write the initial compiled code image into instruction memory. Alternatively, a DMA engine on the accelerator may read the compiled code from the memory of the host machine 205.

The initial compiled code image includes the user's compiled code statically linked with a runtime library, a system firmware library, and any necessary language support libraries. The image is a pre-located ELF image; no dynamic relocation is required. The entry point of the ELF image provides the reset vector for the processors. Once the image has been transferred to the accelerator, the service processor core can be started. The host machine may also configure the control registers on the accelerator according to their desired initial values or reset vector.

All processors will start at the same reset vector. At startup time, the initial register contents are undefined. Each processor inspects its HARTID register to determine which core it is and proceeds accordingly. Each core sets up its initial stack. In some embodiments, the stack area is set at (BASE+HARTID*size) for some values of BASE and size. The core with HARTID==0 identifies itself as the service processor and continues to initialize the system. Specifically, low-level environment (e.g., OS), C library, scheduler block, memory gasket, are initialized. The service processor then starts and executes the simulator runtime startup. At one point during this procedure, the active region set is run once to set up the Verilog "always" blocks. This step makes use of the hardware scheduler and worker processors. The runtime initialization (boot sequence) then completes.

K. Example Electronic System

Figure 14:
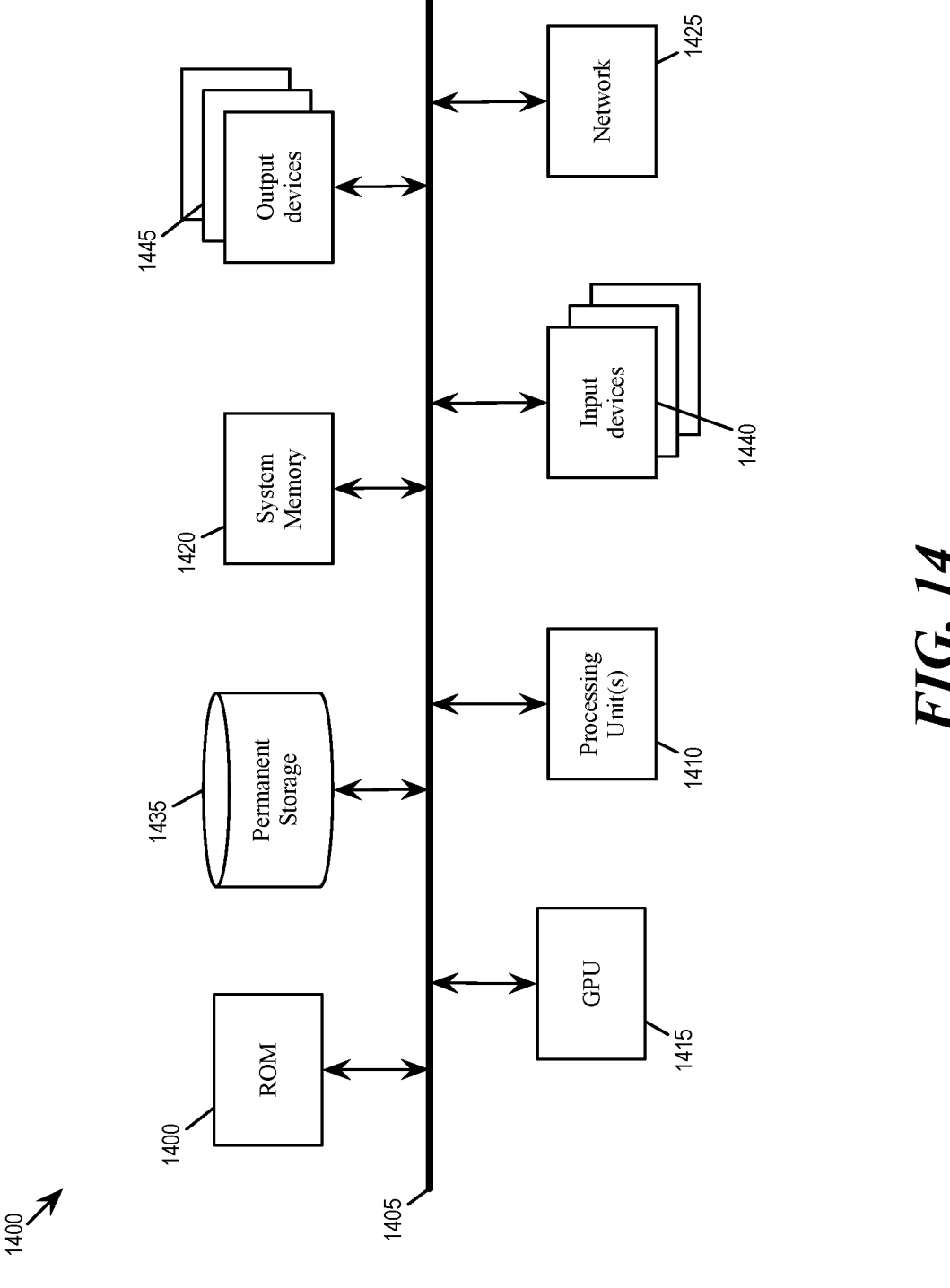
FIG. 14 conceptually illustrates a computer system with which some embodiments of the invention are implemented.

FIG. 14 conceptually illustrates a computer system 1400 with which some embodiments of the invention are implemented. The computer system 1400 can be used to implement any of the above-described hosts, controllers, and managers. As such, it can be used to execute any of the above-described processes. This computer system 1400 includes various types of non-transitory machine-readable media and interfaces for various other types of machine-readable media. Computer system 1400 includes a bus 1405, processing unit(s) 1410, a system memory 1420, a read-only memory 1430, a permanent storage device 1435, input devices 1440, and output devices 1445.

The bus 1405 collectively represents all system, peripheral, and chipset buses that communicatively connect the numerous internal devices of the computer system 1400. For instance, the bus 1405 communicatively connects the processing unit(s) 1410 with the read-only memory 1430, the system memory 1420, and the permanent storage device 1435.

From these various memory units, the processing unit(s) 1410 retrieve instructions to execute and data to process in order to execute the processes of the invention. The processing unit(s) 1410 may be a single processor or a multi-core processor in different embodiments. The read-only-memory (ROM) 1430 stores static data and instructions that are needed by the processing unit(s) 1410 and other modules of the computer system 1400. The permanent storage device 1435, on the other hand, is a read-and-write memory device. This device 1435 is a non-volatile memory unit that stores instructions and data even when the computer system 1400 is off. Some embodiments of the invention use a mass-storage device (such as a magnetic or optical disk and its corresponding disk drive) as the permanent storage device 1435.

Other embodiments use a removable storage device (e.g., flash drive, etc.) as the permanent storage device 1435. Like the permanent storage device 1435, the system memory 1420 is a read-and-write memory device. However, unlike storage device 1435, the system memory 1420 is a volatile read-and-write memory, such as random access memory. The system memory 1420 stores some of the instructions and data that the processor needs at runtime. In some embodiments, the invention's processes are stored in the system memory 1420, the permanent storage device 1435, and/or the read-only memory 1430. From these various memory units, the processing unit(s) 1410 retrieve instructions to execute and data to process in order to execute the processes of some embodiments.

The bus 1405 also connects to the input and output devices 1440 and 1445. The input devices 1440 enable the user to communicate information and select commands to the computer system 1400. The input devices 1440 include alphanumeric keyboards and pointing devices (also called "cursor control devices"). The output devices 1445 display images generated by the computer system 1400. The output devices 1445 include printers and display devices, such as cathode ray tubes (CRT) or liquid crystal displays (LCD). Some embodiments include devices such as a touchscreen that function as both input and output devices 1440 and 1445.

Finally, as shown in FIG. 14, bus 1405 also couples computer system 1400 to a network 1425 through a network adapter (not shown). In this manner, the computer 1400 can be a part of a network of computers (such as a local area network ("LAN"), a wide area network ("WAN"), or an Intranet, or a network of networks, such as the Internet. Any or all components of computer system 1400 may be used in conjunction with the invention.

Some embodiments include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra-density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application-specific integrated circuits (ASICs) or field-programmable gate arrays (FPGAs). In some embodiments, such integrated circuits execute instructions that are stored on the circuit itself.

As used in this specification, the terms "computer", "server", "processor", and "memory" all refer to electronic or other technological devices. These terms exclude people or groups of people. For the purposes of the specification, the terms display or displaying means displaying on an electronic device. As used in this specification, the terms "computer-readable medium," "computer-readable media," and "machine-readable medium" are entirely restricted to tangible, physical objects that store information in a form that is readable by a computer. These terms exclude any wireless signals, wired download signals, and any other ephemeral or transitory signals.

While the invention has been described with reference to numerous specific details, one of ordinary skill in the art will recognize that the invention can be embodied in other specific forms without departing from the spirit of the invention. Several embodiments described above include various pieces of data in the overlay encapsulation headers. One of ordinary skill will realize that other embodiments might not use the encapsulation headers to relay all of this data.

Also, several figures conceptually illustrate processes of some embodiments of the invention. In other embodiments, the specific operations of these processes may not be performed in the exact order shown and described in these figures. The specific operations may not be performed in one continuous series of operations, and different specific operations may be performed in different embodiments. Furthermore, the process could be implemented using several sub-processes, or as part of a larger macro process. Thus, one of ordinary skill in the art would understand that the invention is not to be limited by the foregoing illustrative details, but rather is to be defined by the appended claims.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:

receiving source code of a design comprising register transfer level (RTL) code and testbench code;

compiling the source code into compiled code, the compiled code comprising instructions for simulating behaviors of the design, one or more first blocks, and one or more second blocks, wherein the one or more first blocks are statically sorted into levels such that blocks of a same level have no logical dependency with each other;

scheduling the instructions to be executed by a plurality of processors based on simulation events occurring at different simulation timesteps, wherein the simulation events are determined according to the executed instructions, and wherein instructions are scheduled so the instructions of the one or more first blocks are not executed in parallel with the instructions of the one or more second blocks;

capturing trace data generated by the execution of the scheduled instructions, the trace data comprising data captured from one or more memory ranges identified by the compiler; and providing the captured trace data.

2. The method of claim 1, wherein the RTL codes of the design are compiled as the one or more one or more first blocks and at least some of the testbench code are compiled as the one or more second blocks.

3. The method of claim 1, wherein the instructions of the compiled code comprise one or more transactions, each transaction comprising one or more instructions designated as belonging to the transaction, wherein upon completion of the transaction, data generated by a first processor executing the transaction is committed to a heap memory and is aborted when an abort condition has occurred.

4. The method of claim 3, wherein the abort condition occurs when the first processor and a second processor have conflicting writes to their respective caches.

5. The method of claim 3, wherein the instructions of the one or more first are not executed as transactions.

6. The method of claim 3, wherein a particular transaction comprises an instruction that is deferred to execute until the particular transaction is committed to the heap memory.

7. The method of claim 6, wherein the deferred instruction mutates a global state and returns no result.

8. The method of claim 3, wherein when a first transaction and a second transaction are scheduled to be executed in a same timestep, the execution of the first transaction aborts and restarts after the second transaction is complete but in the same timestep.

9. The method of claim 1, wherein the compiled code comprises a plurality of prefetch sections that is defined by a compiler, wherein each prefetch section comprises a set of instructions that occupies a memory storage space that can fit within an instruction cache of a processor.

10. The method of claim 9, wherein the compiled code further comprises a set of prefetching directives that is determined based on relationships between logical blocks in the design by the compiler, the method further comprising identifying one or more prefetch sections according to the prefetching directives and prefetching the identified prefetch sections for the processor.

11. The method of claim 1, wherein the plurality of processors request memory allocations from a plurality of queues, each queue for storing pointers of memory allocations of a specific size, different queues correspond to memory allocations of different sizes.

12. The method of claim 11, further comprising reclaiming memory allocations that are leaked and replenishing the queues with pointers of the reclaimed memory allocations.

13. The method of claim 1, further comprising defining a plurality of prefetch sections in the compiled code, wherein each prefetch section comprises a set of instructions that occupies a memory storage space that can fit within an instruction cache of a processor, wherein the compiled code further comprises a set of prefetching directives that is determined based on relationships between logical blocks in the design, the method further comprising identifying one or more prefetch sections according to the prefetching directives and prefetching the identified prefetch sections for the processor.

14. The method of claim 1, wherein the plurality of processors request memory allocations from a plurality of queues, each queue for storing pointers of memory allocations of a specific size, different queues correspond to memory allocations of different sizes, the method further comprising reclaiming memory allocations that are leaked and replenishing the queues with pointers of the reclaimed memory allocations.

* * * * *